(12) United States Patent
Huang et al.

(10) Patent No.: US 12,148,812 B2
(45) Date of Patent: Nov. 19, 2024

(54) NANO-SHEET-BASED DEVICES HAVING INNER SPACER STRUCTURES OR GATE PORTIONS WITH VARIABLE DIMENSIONS

(71) Applicant: Taiwan Semiconductor Manufacturing Co., Ltd., Hsin-Chu (TW)

(72) Inventors: Jui-Chien Huang, Hsinchu (TW); Kuo-Cheng Chiang, Hsinchu County (TW); Chih-Hao Wang, Hsinchu County (TW); Shi Ning Ju, Hsinchu (TW); Guan-Lin Chen, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 72 days.

(21) Appl. No.: 17/814,952

(22) Filed: Jul. 26, 2022

(65) Prior Publication Data

US 2022/0376072 A1 Nov. 24, 2022

Related U.S. Application Data

(62) Division of application No. 16/941,504, filed on Jul. 28, 2020, now Pat. No. 11,610,977.

(51) Int. Cl.
*H01L 29/66* (2006.01)
*H01L 21/8234* (2006.01)
(Continued)

(52) U.S. Cl.
CPC ........... *H01L 29/66553* (2013.01); *H01L 21/823412* (2013.01); *H01L 21/823418* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,796,666 B1 8/2014 Huang et al.
8,822,243 B2 9/2014 Yan et al.
(Continued)

*Primary Examiner* — Younes Boulghassoul
(74) *Attorney, Agent, or Firm* — HAYNES AND BOONE, LLP

(57) ABSTRACT

A device includes a first channel layer over a semiconductor substrate, a second channel layer over the first channel layer, and a third channel layer over the second channel layer. The channel layers each connects a first and a second source/drain along a first direction. The device also includes a first gate portion between the first and second channel layers; a second gate portion between the second and third channel layers; a first inner spacer between the first and second channel layers and between the first gate portion and the first source/drain; and a second inner spacer between the second and third channel layers and between the second gate portion and the first source/drain. The first and second gate portions have substantially the same gate lengths along the first direction. The first inner spacer has a width along the first direction that is greater than the second inner spacer has.

20 Claims, 23 Drawing Sheets

(51) Int. Cl.

| | | |
|---|---|---|
| *H01L 27/088* | (2006.01) | |
| *H01L 29/06* | (2006.01) | |
| *H01L 29/417* | (2006.01) | |
| *H01L 29/423* | (2006.01) | |
| *H01L 29/78* | (2006.01) | |
| *H01L 29/786* | (2006.01) | |
| *H01L 29/08* | (2006.01) | |

(52) U.S. Cl.
CPC ........... *H01L 21/823431* (2013.01); *H01L 21/823437* (2013.01); *H01L 27/0886* (2013.01); *H01L 29/0653* (2013.01); *H01L 29/0673* (2013.01); *H01L 29/41775* (2013.01); *H01L 29/42392* (2013.01); *H01L 29/6653* (2013.01); *H01L 29/66545* (2013.01); *H01L 29/6681* (2013.01); *H01L 29/7853* (2013.01); *H01L 29/78696* (2013.01); *H01L 29/0847* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/66553; H01L 29/0653; H01L 21/823468; H01L 21/823864; H01L 29/6653; H01L 29/6656; H01L 21/823481; H01L 21/823878; H01L 29/42376; H01L 29/42384; H01L 29/7856; H01L 29/66545; H01L 21/28114; H01L 21/823437; H01L 21/823828; H01L 21/823456; H01L 21/82385
See application file for complete search history.

(56) References Cited

U.S. PATENT DOCUMENTS

| | | | |
|---|---|---|---|
| 8,987,142 B2 | 3/2015 | Lee et al. | |
| 9,093,530 B2 | 4/2015 | Huang et al. | |
| 9,053,279 B2 | 6/2015 | Chang et al. | |
| 9,099,530 B2 | 8/2015 | Lin et al. | |
| 9,153,478 B2 | 10/2015 | Liu et al. | |
| 9,501,601 B2 | 11/2016 | Chang et al. | |
| 9,548,303 B2 | 1/2017 | Lee et al. | |
| 9,876,114 B2 | 1/2018 | Huang | |
| 10,134,640 B1* | 11/2018 | Chiang | H01L 29/78651 |
| 11,315,925 B2* | 4/2022 | Huang | H01L 21/823431 |
| 11,855,096 B2* | 12/2023 | Huang | H01L 29/0665 |
| 2015/0380313 A1* | 12/2015 | Ching | H01L 29/66795 |
| | | | 438/283 |
| 2017/0200738 A1* | 7/2017 | Kim | H01L 29/66439 |
| 2017/0365604 A1* | 12/2017 | Suh | H01L 21/823878 |
| 2018/0047832 A1* | 2/2018 | Tapily | H01L 29/66545 |
| 2018/0294331 A1* | 10/2018 | Cho | H01L 29/41725 |
| 2018/0301531 A1* | 10/2018 | Xie | H01L 21/02532 |
| 2019/0157386 A1* | 5/2019 | Ando | H01L 21/02543 |
| 2020/0098756 A1* | 3/2020 | Lilak | H01L 29/66545 |
| 2020/0219879 A1* | 7/2020 | Shin | H01L 21/02532 |
| 2021/0066294 A1* | 3/2021 | Huang | H01L 29/66818 |
| 2021/0126102 A1* | 4/2021 | Nakjin | H01L 29/42376 |
| 2021/0305388 A1* | 9/2021 | Lilak | H01L 29/42368 |
| 2022/0013521 A1* | 1/2022 | Zhang | H01L 27/1211 |

* cited by examiner

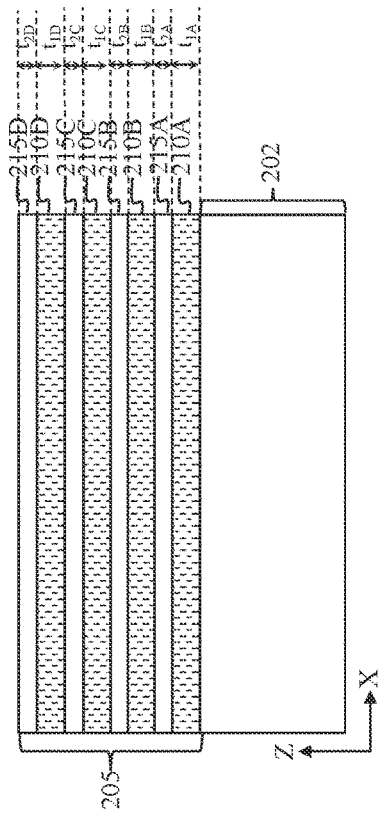
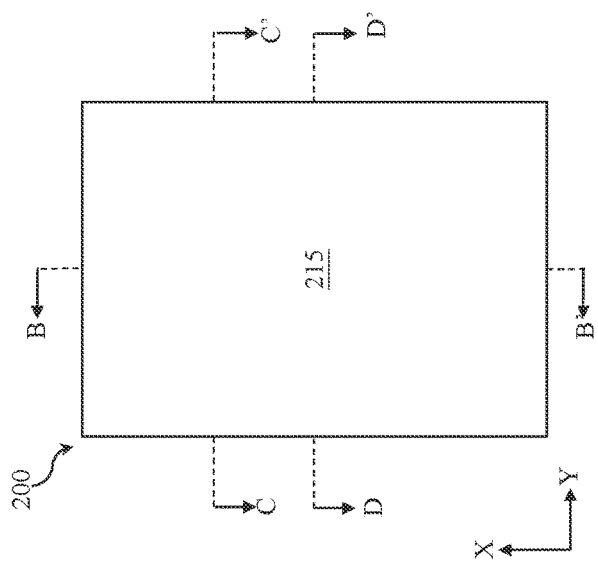
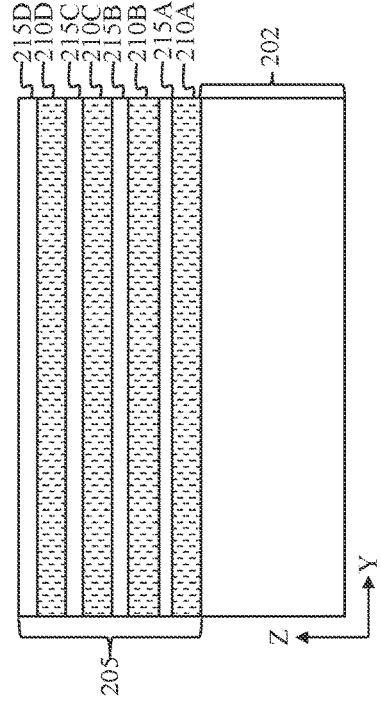
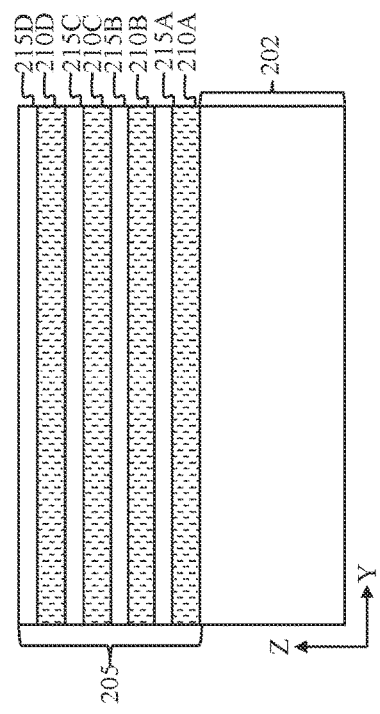

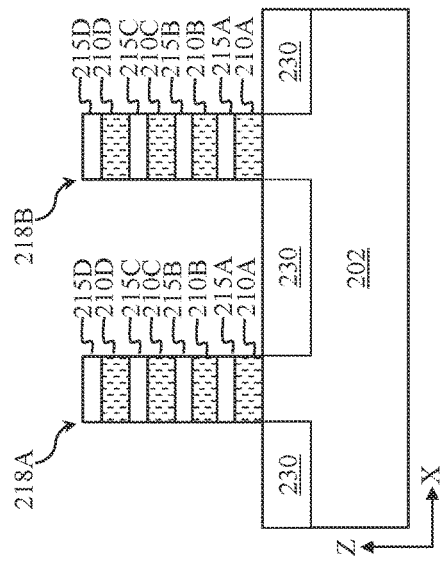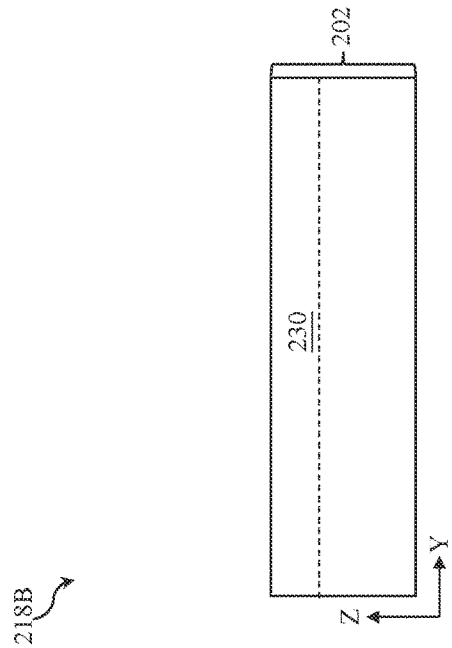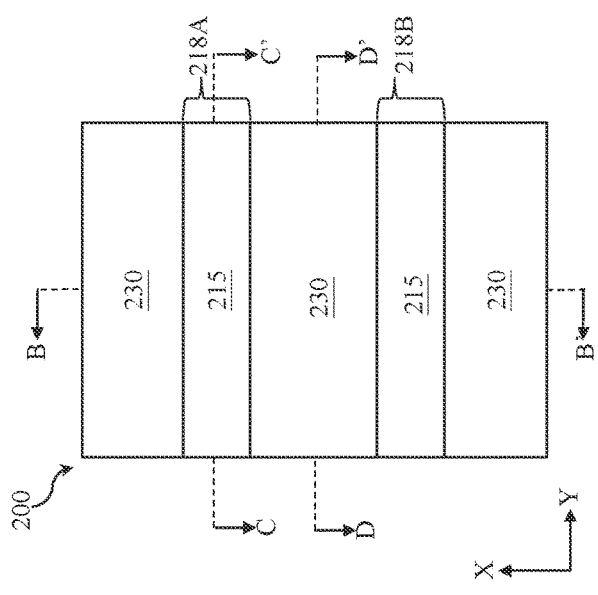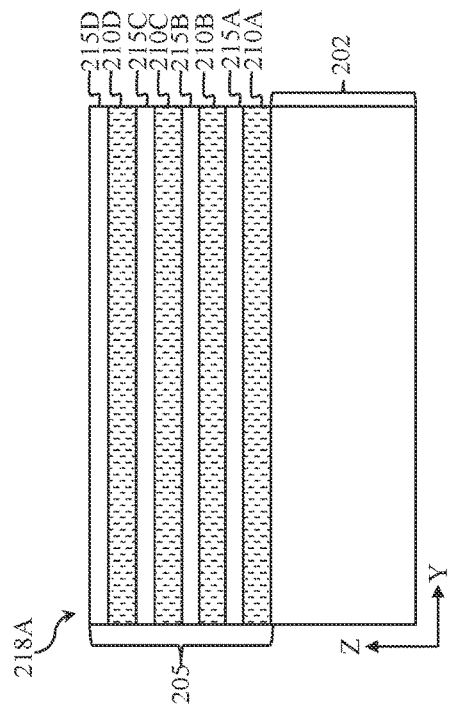

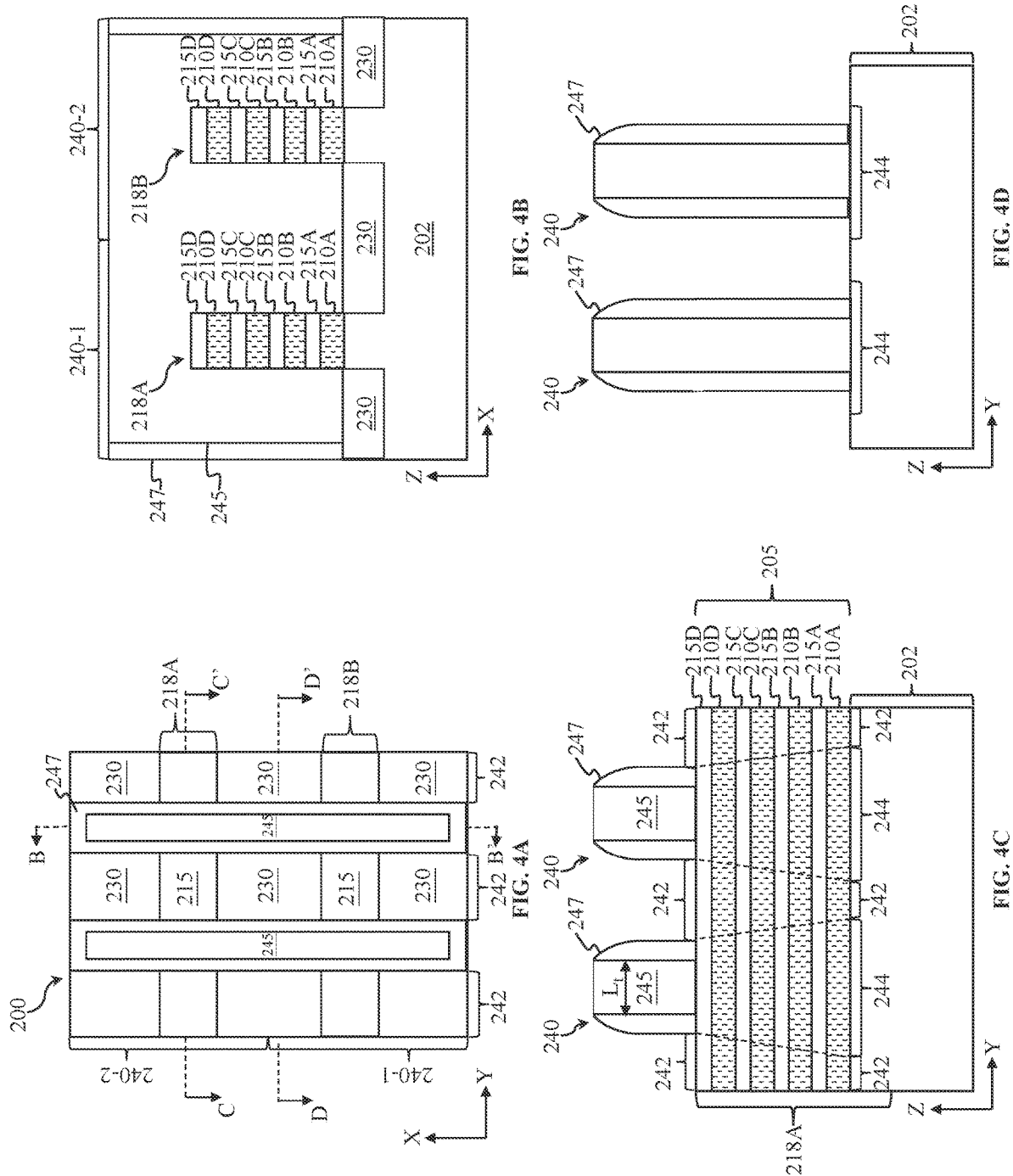

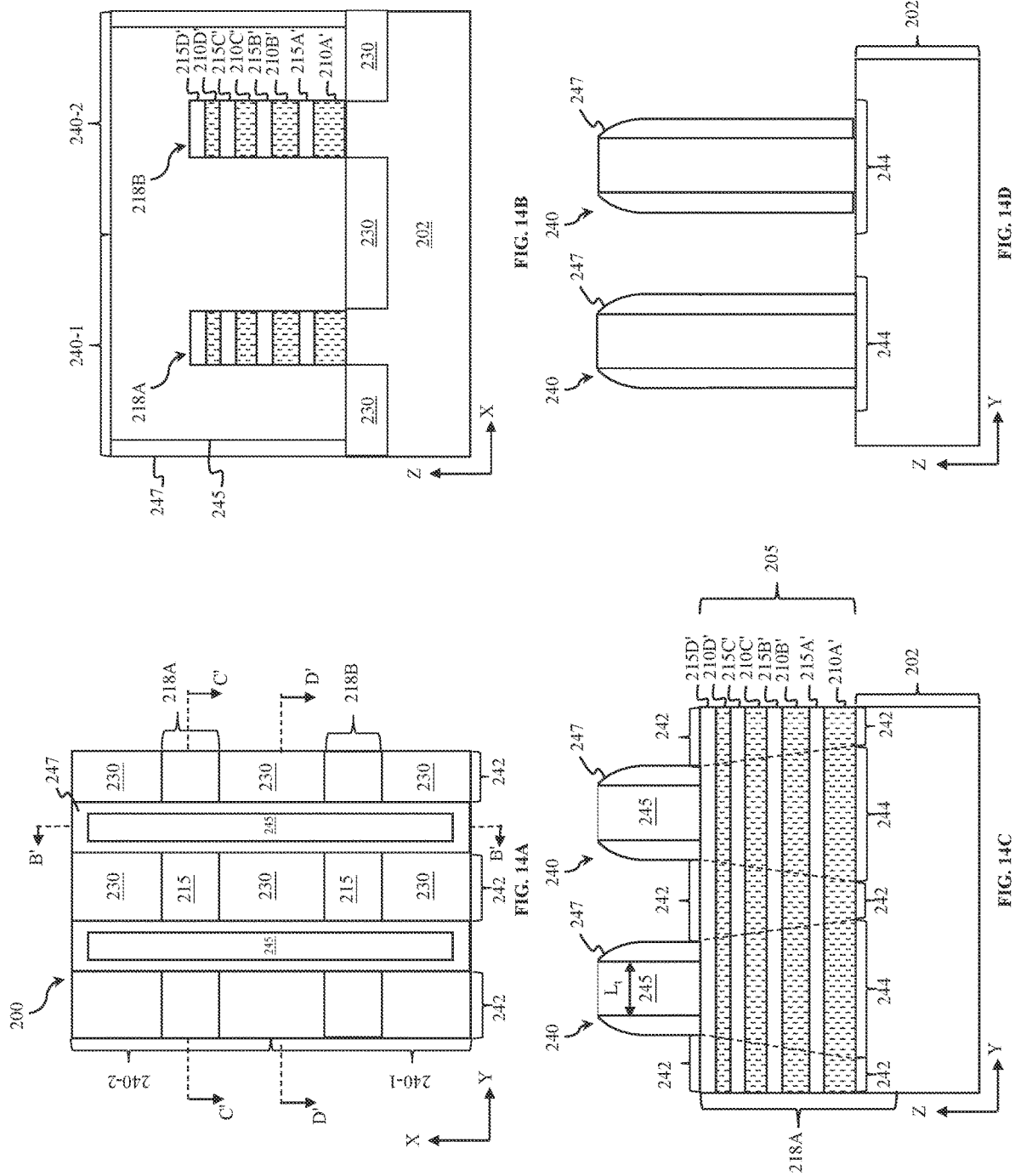

NANO-SHEET-BASED DEVICES HAVING INNER SPACER STRUCTURES OR GATE PORTIONS WITH VARIABLE DIMENSIONS

PRIORITY

This is a divisional application of and claims priority to U.S. application Ser. No. 16/941,504, filed Jul. 28, 2020, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, nano-sheet-based devices have been introduced in an effort to improve gate control by increasing gate-channel coupling, reduce OFF-state current, and reduce short-channel effects (SCEs). Nano-sheet-based devices include a plurality of suspended gate channel layers stacked together to form the gate structure. The nano-sheet-based devices are compatible with conventional complementary metal-oxide-semiconductor (CMOS) processes, allowing them to be aggressively scaled down while maintaining gate control and mitigating SCEs. However, conventional methods for nano-sheet-based devices may suffer high capacitance between the gate electrode and the epitaxial features and therefore fail to reach optimal device performances (such as operational speeds). Therefore, although conventional nano-sheet-based devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 3A, 4A, 12A, 13A, and 14A are top views (e.g. in an X-Y plane) of embodiments of semiconductor devices of the present disclosure at different stages of processing according to some embodiments of the present disclosure.

FIGS. 2B, 3B, 4B, 12B, 13B, and 14B are cross sectional views (e.g. in an X-Z plane) of embodiments of semiconductor devices of the present disclosure of a cross section illustrated by the B-B' line of FIGS. 2A, 3A, and 4A at different stages of processing according to some embodiments of the present disclosure.

FIGS. 2C, 3C, 4C, 5, 6, 7, 8, 9, 10, 12C, 13C, 14C, 15, 16, 17, 18, 19, and 20 are cross-sectional views (e.g. in a Y-Z plane) of embodiments of semiconductor devices of the present disclosure of a cross section illustrated by the C-C' line of FIGS. 2A, 3A, and 4A at different stages of processing according to some embodiments of the present disclosure.

FIGS. 2D, 3D, 4D, 11, 12D, 13D, 14D, and 21 are cross-sectional views (e.g. in a Y-Z plane) of embodiments of semiconductor devices of the present disclosure of a cross section illustrated by the D-D' line of FIGS. 2A, 3A, and 4A, at different stages of processing according to some embodiments of the present disclosure.

DETAILED DESCRIPTION

Figure 1:
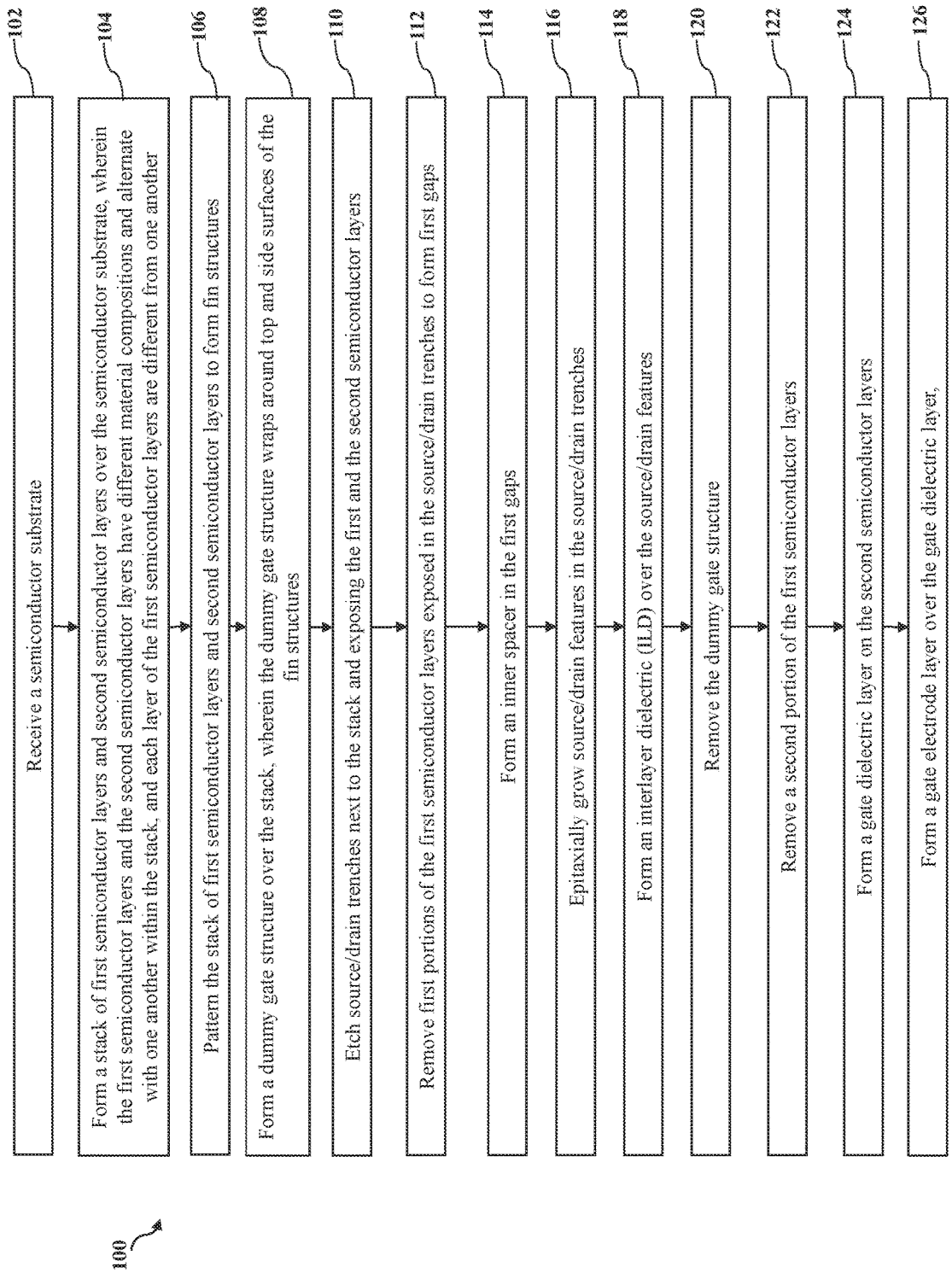
FIG. 1 is a flow chart of an example method for fabricating an embodiment of semiconductor devices of the present disclosure according to some embodiments of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to ICs and semiconductor devices and methods of forming the same. More particularly, the present disclosure is related to nano-sheet-based devices. A nano-sheet-based device includes any device that has a plurality of suspended gate channel layers stacked together to form the gate structure. Nanosheet-based devices include gate-all-around (GAA) devices, multi-bridge-channel (MBC) devices, and other similar devices. Furthermore, the nano-sheet-based devices may include gate channel layers of any suitable shapes and/or configurations. For example, the gate channel layers may be in one of many different shapes, such as wire (or nanowire), sheet (or nanosheet), bar (or nano-bar), and/or other suitable shapes. In other words, the term nano-sheet-based devices broadly encompasses devices having gate channel layers in nanowire, nano-bars, and any other suitable shapes. The nano-sheet based devices presented herein may be a complementary metal-oxide-semiconductor (CMOS) device, a p-type metal-oxide-semiconductor (pMOS) device, or an n-type metal-oxide-semiconductor (nMOS) device. Further, the gate channel layers of the nano-sheet-based devices may engage with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

The present disclosure provides embodiments of nano-sheet devices and methods for fabricating nano-sheet-based devices having gate portions with substantially equal gate lengths. In some embodiments, aspects of the present disclosure reduce the total capacitance in the region between the source/drain features and the gate electrode, which can lead to overall higher performances (such as higher speeds). In the illustrated exemplary embodiments, the IC device includes a nano-sheet-based device. The nano-sheet-based device may be fabricated during processing of the IC, or a portion thereof, that may comprise static random access memory (SRAM) and/or logic circuits, passive components such as resistors, capacitors, and inductors, and active components such as p-type field effect transistors (pFETs), n-type FETs (nFETs), FinFETs, MOSFETs, CMOS, bipolar transistors, high voltage transistors, high frequency transistors, other memory cells, and combinations thereof.

FIG. 1 is a flow chart of an example method for fabricating an embodiment of a semiconductor device of the present disclosure according to some embodiments of the present disclosure. FIGS. 2A-4A are top views (e.g. in an X-Y plane) of an embodiment of a semiconductor device 200 of the present disclosure constructed at various fabrication stages according to some embodiments of the present disclosure. FIGS. 2B-4B, 2C-4C, 2D-4D, and 5-11 are cross sectional views (e.g. in an X-Z plane or a Y-Z plane) of an embodiment of a semiconductor device 200 of the present disclosure of the cross-section illustrated by the lines B-B', C-C', and D-D' of FIGS. 2A-4A, respectively, according to some embodiments of the present disclosure. FIGS. 12A-14A, 12B-14B, 12C-14C, and 15-21 illustrate another embodiment of FIG. 1 discussed below. These embodiments are suitable for use separately or in conjunction.

Referring to block 102 of FIG. 1 and FIGS. 2A-2D, an initial semiconductor structure 200 is received. The initial semiconductor structure 200 includes a semiconductor substrate 202. In some embodiments, the semiconductor substrate 202 contains a semiconductor material, such as bulk silicon (Si). Alternatively or additionally, substrate 202 includes another elementary semiconductor material, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of device 200. The doped regions may be a p-type doped region (referred to hereinafter as a p-well), which can be configured for n-type transistors, or an n-type doped region (referred to hereinafter as an n-well), which can be configured for p-type transistors. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Referring to block 104 of FIG. 1 and FIGS. 2A-2D, a semiconductor layer stack 205 is formed over substrate 202, where semiconductor layer stack 205 includes semiconductor layers 210 (including semiconductor layers 210A, 210B, 210C, 210D, and so on) and semiconductor layers 215 (including semiconductor layers 215A, 215B, 215C, 215D, and so on) stacked vertically (e.g., along the Z-direction) in an interleaving or alternating configuration from a surface of substrate 202. In some embodiments, semiconductor layers 210 and semiconductor layers 215 are epitaxially grown in the depicted interleaving and alternating configuration. For example, a first layer of semiconductor layers 210 (semiconductor layer 210A) is epitaxially grown on substrate, a first layer of semiconductor layers 215 (semiconductor layer 215A) is epitaxially grown on the semiconductor layers 210A, a second layer of semiconductor layers 210 (semiconductor layer 210B) is epitaxially grown on the semiconductor layers 215A, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215. The composition may be suitable to achieve etching selectivity during subsequent processing. In some embodiments, semiconductor layers 210 (such as semiconductor layers 210A, 210B, 210C, and 210D) have a first set of etch rates to an etchant and semiconductor layers 215 (such as semiconductor layers 215A, 215B, 215C, and 215D) have a second set of etch rates to the same etchant. The second set of etch rates are generally less than the first set of etch rates. Semiconductor layers 210 and semiconductor layers 215 include different materials, material components, constituent atomic percentages, constituent weight percentages, thicknesses, and/or characteristics to achieve desired etching selectivity during an etching process, such as an etching process implemented to form suspended channel layers in channel regions of device 200. For example, in an embodiment, semiconductor layers 210 include silicon germanium and semiconductor layers 215 include silicon. A silicon etch rate of semiconductor layers 215 is generally less than a silicon germanium etch rate of semiconductor layers 210 in an etchant, such as in a fluorine-based gas or in a SiGe oxidizer/oxide etchant. The semiconductor layers 215 may be suitably composed to provide a channel region of the device 200. The present disclosure contemplates that semiconductor layers 210 and semiconductor layers 215 include any combination of semiconductor materials that can provide desired etching selectivity, etch rate differences, and/or desired performance characteristics (e.g., materials that maximize current flow), including any of the semiconductor materials disclosed herein.

In some embodiments, each layer of semiconductor layers 210 include a same material (e.g., SiGe) but with different constituent atomic percentages. As explained in more detail below with respect to FIGS. 6 and 22, this variation in constituent atomic percentages results in etch rate differences between each of semiconductor layers 210, and allows the gate channel lengths to be controlled for the purpose of improving device performances. For example, semiconductor layer 210A has a first silicon atomic percentage and a first germanium atomic percentage; semiconductor layer 210B has a second and different silicon atomic percentage and a second and different germanium atomic percentage; semiconductor layer 210C has a third and different silicon atomic percentage and a third and different germanium atomic percentage; and semiconductor layer 210D has a fourth and different silicon atomic percentage and a fourth and different germanium atomic percentage. The proper constituent atomic percentages may be determined based on criteria explained in detail later. In some embodiments, the semiconductor layer 210A may have a germanium atomic percentage of about 16% to about 50%; the semiconductor layer 210B may have a germanium atomic percentage of about 14% to about 47%; the semiconductor layer 210C may have a germanium atomic percentage of about 12% to about 45%; and the semiconductor layer 210D may have a germanium atomic percentage of about 10% to about 43%. Similarly, each semiconductor layer 210 may have a silicon atomic percentage different from each other. For example, the semiconductor layer 210A may have a silicon atomic percentage of about 50% to about 84%; the semiconductor layer 210B may have a silicon atomic percentage of about 53% to about 86%; the semiconductor layer 210C may have a silicon atomic percentage of about 55% to about 88%; and the semiconductor layer 210D may have a silicon atomic percentage of about 57% to about 90%. In some embodiments, each semiconductor layer 210 has a germanium atomic percentage that is lower than the adjacent semiconductor layer 210 immediately below it by up to about 10% when measured against the total number of atoms of the semiconductor layer 210. In other words, semiconductor layer 210A has up to about 10% more germanium than the semiconductor layer 210B; the semiconductor layer 210B has up to about 10% more germanium than the semiconductor layer 210C; and semiconductor layer 210C has up to about 10% more germanium than the semiconductor layer 210D. In some embodiments, each semiconductor layer 210 has a germanium atomic percentage that is lower than the adjacent semiconductor layer 210 immediately below it by at least about 1% when measured against the total number of atoms of the semiconductor layer 210. In some embodiments, each semiconductor layer 210 has a silicon atomic percentage that is greater than the adjacent semiconductor layer 210 immediately below it by about 2% to about 3% when measured against the total number of atoms of the semiconductor layer 210. In other words, semiconductor layer 210A has up to about 10% less silicon than the semiconductor layer 210B; the semiconductor layer 210B has up to about 10% less silicon than the semiconductor layer 210C; and semiconductor layer 210C has up to about 10% less silicon than the semiconductor layer 210D. In some embodiments, the germanium (and silicon) atomic percentage difference between the semiconductor layer 210A and semiconductor layer 210B may be the same as or different than the germanium (and silicon) atomic percentage difference between the semiconductor layer 210B and semiconductor layer 210C and/or the germanium (and silicon) atomic percentage difference between the semiconductor layer 210C and the semiconductor layer 210D.

As illustrated in FIG. 2B, the semiconductor layer 210A has a first layer thickness $t_{1A}$; semiconductor layer 210B has a second layer thickness $t_{1B}$; semiconductor layer 210C has a third layer thickness $t_{1C}$; and semiconductor layer 210D has a fourth layer thickness $t_{1D}$. Similarly, the semiconductor layer 215A has a first layer thickness $t_{2A}$; semiconductor layer 215B has a second layer thickness $t_{2B}$; semiconductor layer 215C has a third layer thickness $t_{2C}$; and semiconductor layer 215D has a fourth layer thickness $t_{2D}$. Generally, the layer thicknesses are chosen at least in part based on fabrication and/or device performance considerations for device 200. For example, the thickness of a semiconductor layer 210 can be configured to define a desired distance (or gap) between adjacent channels of device 200 (e.g., between semiconductor layers 215) where a gate electrode is disposed. Thickness of a semiconductor layer 215 can be configured to achieve desired thickness of channels of device 200. Both thicknesses can be configured to achieve desired performance of device 200.

In some embodiments, semiconductor layers 210A, 210B, 210C, and 210D each has a same layer thickness; and semiconductor layers 215A, 215B, 215C, and 215D each has a same layer thickness. In other words, $t_{1A}$, $t_{1B}$, $t_{1C}$, and $t_{1D}$ are substantially the same as one another; and $t_{2A}$, $t_{2B}$, $t_{2C}$, and $t_{2D}$ are substantially the same as one another. In some embodiments, thickness $t_{1A}$-$t_{1D}$ and thickness $t_{2A}$-$t_{2D}$ are each about 1 nm to about 10 nm. However, in some embodiments, semiconductor layers 210A, 210B, 210C, and/or 210D may have different layer thickness including as discussed below with reference to FIGS. 12-21.

As described further below, semiconductor layers 215 or portions thereof form channel regions of device 200. In the depicted embodiment, semiconductor layer stack 205 includes four semiconductor layers 210 and four semiconductor layers 215 configured to form four semiconductor layer pairs disposed over substrate 202, each semiconductor layer pair having a respective first semiconductor layer 210 and a respective second semiconductor layer 215. After undergoing subsequent processing, such configuration will result in device 200 having four channels. However, the present disclosure contemplates embodiments where semiconductor layer stack 205 includes more or fewer semiconductor layers, for example, depending on a number of channels desired for device 200 (e.g., a nano-sheet-based transistor) and/or design requirements of device 200. For example, semiconductor layer stack 205 can include two to ten semiconductor layers 210 and two to ten semiconductor layers 215.

Referring to block 106 of FIG. 1 and FIGS. 3A-3D, semiconductor layer stack 205 is patterned to form a fin 218A and a fin 218B (also referred to as fin structures, fin elements, etc.). Fins 218A, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a Y-direction, having a length defined in the Y-direction, a width defined in an X-direction, and a height defined in a Z-direction. In some implementations, a lithography and/or etching process is performed to pattern semiconductor layer stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

An isolation feature(s) 230 is formed over and/or in substrate 202 to isolate various regions, such as various device regions of device 200. For example, isolation features 230 surround a bottom portion of fins 218A, 218B, such that isolation features 230 separate and isolate fins 218A, 218B from each other. In the depicted embodiment, isolation features 230 surround the substrate portion of fins 218A, 218B and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. For example, isolation features 230 can include STI features that define and electrically isolate fins 218A, 218B from other active device regions (such as fins) and/or passive device regions. STI features can be formed by etching a trench in substrate 202 and/or semiconductor layer stack 205 (for example, by using a dry etching process and/or a wet etching process) as discussed above in patterning of the fins 218A, 218B, and filling the trench with insulator material (for example, by using a CVD process or a spin-on glass process). A chemical mechanical polishing (CMP) process and/or etching processes may be performed to remove excessive insulator material and/or planarize a top surface of isolation features 230. In an embodiment, STI features can be formed by depositing an insulator material over substrate 202 after forming fins 218A, 218B (in some implementations, such that the insulator material layer fills gaps (trenches) between fins 218A, 218B) and etching back the insulator material layer to form isolation features 230. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Referring to block 108 of FIG. 1 and FIGS. 4A-4D, gate structures 240 are formed over portions of fins 218A, 218B and over isolation features 230. The gate structures 240 may be referred to as dummy gate structures as they are subsequently removed as discussed below in reference to block 120 of FIG. 1. Gate structures 240 extend lengthwise in a direction that is different than (e.g., orthogonal to) the lengthwise direction of fins 218A, 218B. For example, gate structures 240 extend substantially parallel to one another along the X-direction, having a length defined in the Y-direction, a width defined in the X-direction, and a height defined in the Z-direction. Gate structures 240 are disposed on portions of fins 218A, 218B and define source/drain regions 242, as well as define intermediate regions 244 between the source/drain regions within which gate channels (such as gate channels formed from the semiconductor layers 215) are subsequently formed. As described later in detail, trenches in the source/drain regions 242 may have canted (or sloped) sidewalls. Accordingly, source/drain regions 242 that accommodate such source/drain trenches may have a large width along the Y-direction at the top surface of the semiconductor layer stack 205 than at the bottom surface of the semiconductor layer stack 205. Accordingly, the intermediate regions 244 may have a smaller width along the Y-direction at the top surface of the semiconductor layer stack 205 than at the bottom surface of the semiconductor layer stack 205. In the X-Z plane, gate structures 240 wrap top surfaces and sidewall surfaces of fins 218A, 218B. In the Y-Z plane, gate structures 240 are disposed over top surfaces of respective intermediate regions 244 of fins 218A, 218B, such that gate structures 240 interpose respective source/drain regions 242. Each gate structure 240 includes a gate region (such as gate regions 240-1 and 240-2) that corresponds with a portion of the respective gate structure 240 that will be configured for a nano-sheet-based transistor (and thus corresponds with a portion spanning a nano-sheet-based transistor region). Gate structures 240 may be configured or sized the same or differently in different gate regions depending on the design requirement of the device 200 (such as to optimize device performances).

In FIGS. 4A-4D, each gate structure 240 includes a dummy gate stack 245. In the depicted embodiment, a width of dummy gate stacks 245 defines a gate length ($L_t$) (here, in the Y-direction) of a top gate portion of gate structure 240. The gate length defines a distance (or length) that current (e.g., carriers, such as electrons or holes) travels between source/drain regions 242 when the transistor is switched on. Gate lengths can be tuned to achieve desired operation speeds of the transistors and/or desired packing density of the transistors. For example, when a transistor is switched on, current flows between source/drain regions of the transistor. Increasing the gate length increases a distance required for current to travel between the source/drain regions, increasing a time it takes for the transistor to switch fully on. Conversely, decreasing the gate length decreases the distance required for current to travel between the source/drain regions, decreasing a time it takes for the transistor to switch fully on. Smaller gate lengths provide transistors that switch on/off more quickly, facilitating faster, high speed operations. Smaller gate lengths also facilitate tighter packing density (i.e., more transistors can be fabricated in a given area of an IC chip), increasing a number of functions and applications that can be fabricated on the IC chip.

In an embodiment, the gate length $L_t$ is configured to provide transistors having short-length (SC) channels. For example, the gate length $L_t$ of top gate portion is about 5 nm to about 20 nm. In some embodiments, the gate length $L_t$ can be configured to provide transistors having mid-length or long-length channels (M/LC). For example, the gate length of M/LC transistors is about 20 nm to about 250 nm. In nano-sheet-based devices, multiple gate portions are formed between and over the channel layers so as to achieve improved gate controls. In some embodiments, these gate portions have different gate lengths (for example, different from each other and/or different from the gate length $L_t$). However, the present disclosure recognizes that different gate lengths lead to higher capacitances, which in turn contributes to reduced device speeds. Some embodiments of the present disclosure therefore provide methods to form gate portions having similar or substantially the same gate lengths. As described in more detail below, this may be accomplished by adjusting relative etch rates of each layers of the semiconductor layers 210 (such as semiconductor layers 210A, 210B, 210C, and 210D) relative to one another).

Dummy gate stacks 245 include a dummy gate electrode, and in some embodiments, a dummy gate dielectric. The dummy gate electrode includes a suitable dummy gate material, such as polysilicon layer. In embodiments where dummy gate stacks 245 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 245 can include numerous other layers, for example, capping layers, interface layers, diffusion layers, barrier layers, hard mask layers, or combinations thereof. For example, dummy gate stacks 245 can further include a hard mask layer disposed over the dummy gate electrode.

Dummy gate stacks 245 are formed by deposition processes, lithography processes, etching processes, other suitable processes, or combinations thereof. For example, a deposition process is performed to form a dummy gate electrode layer over fins 218A, 218B and isolation features 230. In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 245, such that dummy gate stacks 245 (including the dummy gate electrode layer, the dummy gate dielectric layer, the hard mask layer, and/or other suitable layers) is configured as depicted in FIGS. 4A-4D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Each gate structure 240 further includes gate spacers 247 disposed adjacent to (i.e., along sidewalls of) respective dummy gate stacks 245. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 245 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 245. In such implementations, the various sets of spacers can include materials having different etch rates. For example, a first dielectric layer including silicon and oxygen (e.g., silicon oxide) can be deposited and etched to form a first spacer set adjacent to dummy gate stacks 245, and a second dielectric layer including silicon and nitrogen (e.g., silicon nitride) can be deposited and etched to form a second spacer set adjacent to the first spacer set.

Figure 5:
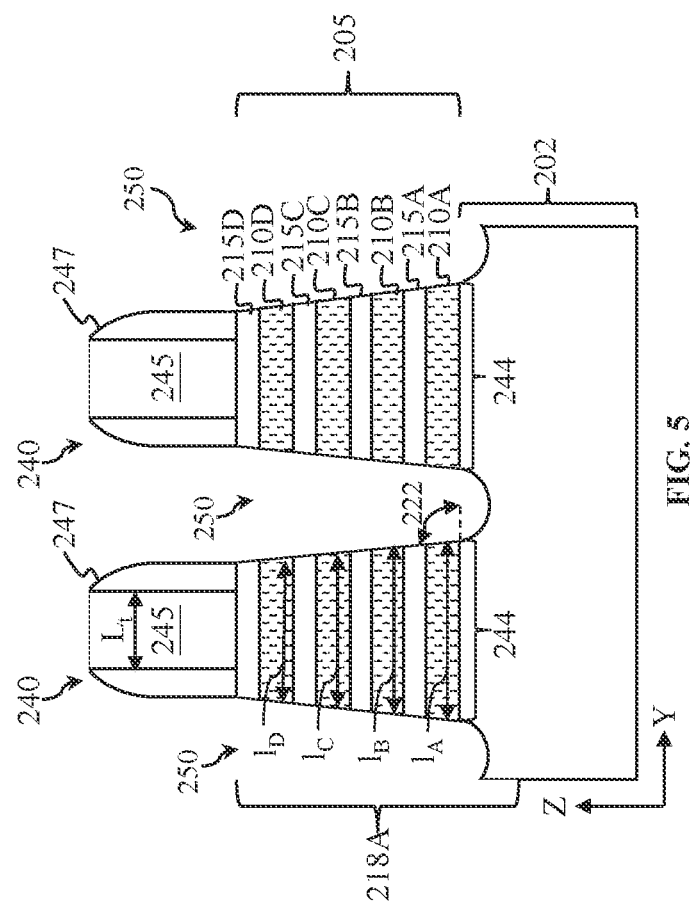

Referring to block 110 of FIG. 1 and FIG. 5, exposed portions of fins (source/drain regions 242 of fin 218A that are not covered by gate structures 240) are at least partially removed to form source/drain trenches (recesses) 250. In the depicted embodiment, an etching process completely removes semiconductor layer stack 205 in source/drain regions 242 of fin 218A, thereby exposing the substrate portion of fin 218A in source/drain regions 242. In other embodiments, the depth of the recesses 250 may vary. Source/drain trenches 250 have sidewalls defined by remaining portions of semiconductor layer stack 205. As described above, the source/drain trenches 250 have canted sidewall surfaces. In some embodiments, the sidewall surfaces of the source/drain trenches each spans an angle 222 from a X-Y plane. The angle 222 may be about 90° to about 105°. This taper profile may result from the different plasma etch efficiency in trenches having high aspect ratios. Accordingly, a bottom portion of a source/drain trench has a smaller width than a top portion of the source/drain trench. Moreover, the semiconductor layers in the remaining portions of the semiconductor layer stack 205 have different lengths along the Y-direction. For example, semiconductor layer 210A, 210B, 210C, and 210D have lengths $l_A$, $l_B$, $l_C$, and $l_D$, respectively (along the Y-direction). As illustrated, length $l_A$ is greater than $l_B$; length $l_B$ is greater than $l_C$, and length $l_C$ is greater than $l_D$. In some embodiments, a ratio of length $l_A$ to length $l_B$ is about 0.9 to 1.0; a ratio of length $l_B$ to length $l_C$ is about 0.9 to 1.0; and a ratio of length $l_C$ to length $l_D$ is about 0.9 to 1.0.

In the depicted embodiment, the source/drain trenches 250 extend into the substrate 202, such that a bottom surface of the source/drain trenches 250 extend below a top surface of the substrate 202. In some embodiments, the source/drain trenches 250 have bottom surfaces defined by substrate 202. In some embodiments (not shown), the etching process removes some, but not all, of semiconductor layer stack 205, such that source/drain trenches 250 have bottoms defined by semiconductor layer 210 or semiconductor layer 215 in source/drain regions 242. The etching process to form the source/drain trenches 250 can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal etching of gate structures 240 (i.e., dummy gate stacks 245 and gate spacers 247) and/or isolation features 230. In some embodiments, a lithography process, such as those described herein, is performed to form a patterned mask layer that covers gate structures 240 and/or isolation features 230, and the etching process uses the patterned mask layer as an etch mask.

Figure 6:
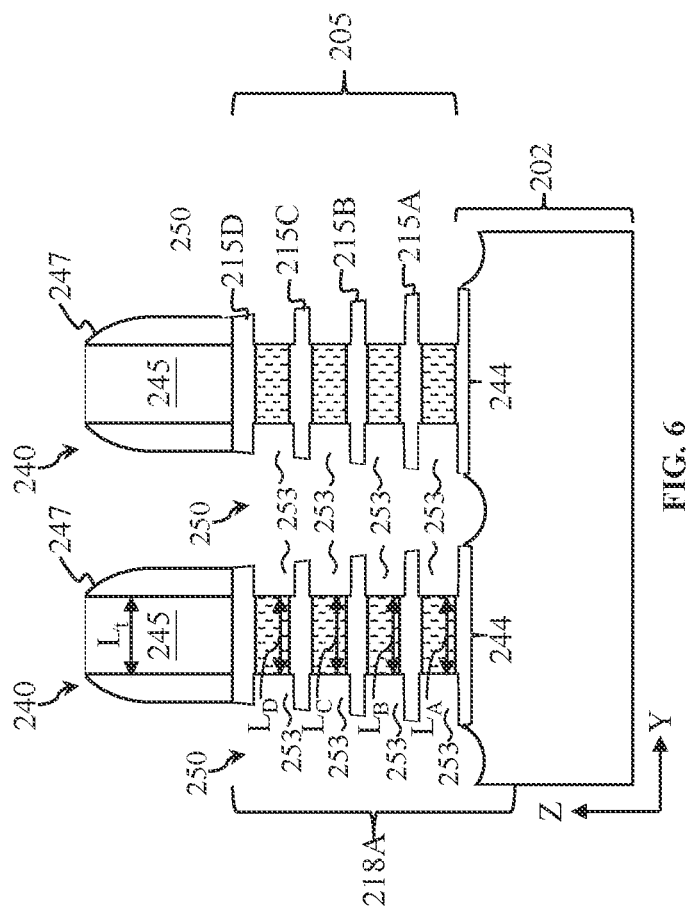

Referring to block 112 of FIG. 1 and FIG. 6, gaps 253 are formed in intermediate regions 244 by removing end portions of the semiconductor layers 210 using a suitable removal process. For example, an etching process is performed that selectively etches semiconductor layers 210 exposed by source/drain trenches 250 with minimal etching of semiconductor layers 215. Accordingly, gaps 253 are formed between semiconductor layers 215 as well as between semiconductor layers 215 and substrate 202. The etching process is configured to laterally etch (e.g., along the Y-direction) semiconductor layers 210, thereby reducing a length of semiconductor layers 210 along the Y-direction. As discussed at length below, the length of each layer 210 may be reduced by a different amount, such that the resultant portion of the layer 210 after etching is substantial equal in length. For example, the length $l_A$ of the semiconductor layer 210A is reduced to $L_A$; the length $l_B$ of the semiconductor layer 210B is reduced to $L_B$; the length $l_C$ of the semiconductor layer 210C is reduced to $L_C$; and the length $l_D$ of the semiconductor layer 210D is reduced to $L_D$. In providing the gaps 253, end portions (edges) of semiconductor layers 215 are suspended in the intermediate regions 244 under gate spacers 247. In some embodiments, the removal of the end portions of the semiconductor layers 210 includes an etching process. The etching process is a dry etching process, a wet etching process, other suitable etching process, or combinations thereof. The etching process may use etching chemicals selected from, for example, fluoride-based gas or SiGe oxidizer/oxide etchant. In an embodiment, an etching process concurrently removes each end portion of semiconductor layers 210.

The reduced lengths $L_A$, $L_B$, $L_C$, and $L_D$ each define the gate length of a gate portion subsequently formed in the respective region of the semiconductor layers 210A, 210B, 210C, or 210D as discussed below. For the purpose of achieving uniform gate lengths, a larger portion of the semiconductor layer 210A (corresponding to the length difference $l_A$-$L_A$) needs to be removed than that of the semiconductor layer 210B (corresponding to the length difference $l_B$-$L_B$). Similarly, a larger portion of the semiconductor layer 210B (corresponding to the length difference $l_B$-$L_B$) needs to be removed than that of the semiconductor layer 210C (corresponding to the length difference $l_C$-$L_C$); and a larger portion of the semiconductor layer 210C (corresponding to the length difference $l_C$-$L_C$) needs to be removed than that of the semiconductor layer 210D (corresponding to the length difference $l_D$-$L_D$). In an embodiment, the etching providing the reduced lengths $L_A$, $L_B$, $L_C$, and $L_D$ from the original lengths $l_A$, $l_B$, $l_C$, and $l_D$ is provided in a single etching process, such that the reductions in lengths for each of layers 210A, 210B, 210C, and 210D is achieved concurrently. In order to remove the relatively larger portions concurrently with the relatively smaller portions, it is necessary for the bottom layers of the semiconductor layers 210 to have higher etch rates than the top layers of the semiconductor layers 210. For example, there may be a decreasing cascade of etch rates from the semiconductor layers 210A, the semiconductor layer 210B, the semiconductor layer 210C, to the semiconductor layer 210D.

Figure 22:
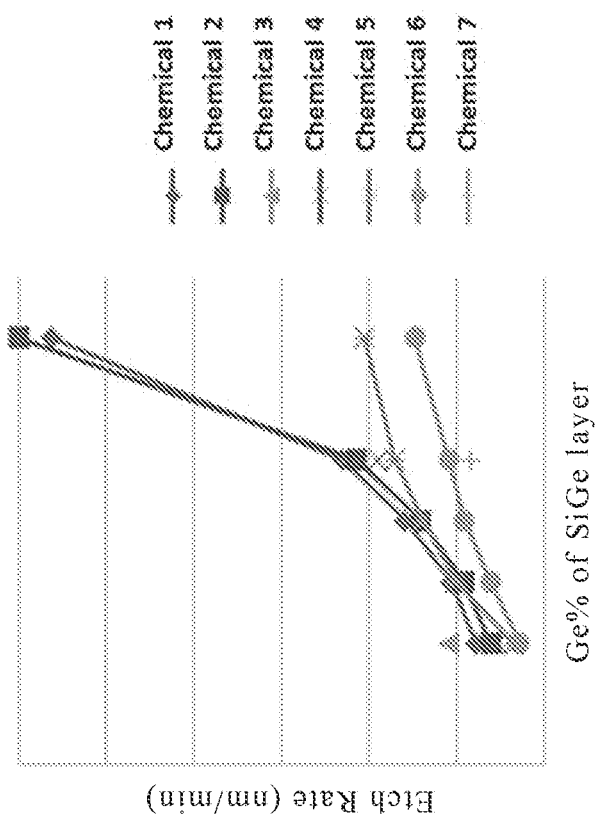
FIG. 22 is a graph illustrating an effect of material compositions on the etch rate of the semiconductor layer.

In an embodiment and referring to FIG. 6, this decreasing cascade of etch rates is accomplished by configuring the semiconductor layers 210A, 210B, 210C, and 210D to have different constituent atomic percentages. As described above with respect to block 104 of FIG. 1 and FIGS. 2A-2D, the different germanium atomic percentages result in different etch rates of the semiconductor layers 210. In some embodiments, the proper differences in germanium atomic percentages may be determined experimentally from the sidewall profile of the source/drain trenches 250, the desired uniform gate lengths, and the relationship function between the germanium contents, the etch rates, and the chosen etching chemical. An exemplary relationship function between the germanium contents and the etch rates is illustrated in FIG. 22. Silicon germanium (SiGe) layers with different germanium atomic percentages (Ge %) are etched at different rates when they are subjected to same etching chemicals, such as Chemical 1 to Chemical 7. A smaller Ge % generally leads to a lower etch rate of the SiGe layer in all tested chemical etchants. In some embodiments, by increasing the Ge % by a factor of about 2, the etch rate increases by a factor of 7. Accordingly, the proper constituent atomic percentages for each layer of semiconductor layers 210 may be determined, before forming the semiconductor layer stack 205, at least partially based on FIG. 22.

Accordingly, the semiconductor layers 210A has a greater etch rate in the etching chemical than that of the semiconductor layer 210B such that the removed end portions of the semiconductor 210A (corresponding to the length difference $l_A-L_A$) are of a greater size than the removed end portions of the semiconductor layer 210B (corresponding to the length difference $l_B-L_B$) during the same, concurrent etching process. Similarly, the semiconductor layers 210B has a greater etch rate in the etching chemical than that of the semiconductor layer 210C such that the removed end portions of the semiconductor 210B are of a greater size than the removed end portions of the semiconductor layer 210C during the same, concurrent etching process; and the semiconductor layers 210C has a greater etch rate than that of the semiconductor layer 210D such that the removed end portions of the semiconductor 210C are of a greater size than the removed end portions of the semiconductor layer 210D during the same, concurrent etching process. As a result, the lengths $L_A$, $L_B$, $L_C$, and $L_D$ of the etched semiconductor layers 210A, 210B, 210C, and 210D may be rationally controlled by tuning the constituent atomic percentages of the semiconductor layers 210. In some embodiments, the constituents' atomic percentages are selected such that the lengths $L_A$, $L_B$, $L_C$, and $L_D$ are substantially the same as one another. Moreover, in the depicted embodiment, $L_A$, $L_B$, $L_C$, and $L_D$ are further each about equal to the gate length $L_t$. As described above, the lengths $L_A$, $L_B$, $L_C$, and $L_D$, as well as the length $L_t$, each define a gate length of a gate portion of gate structure 240. Therefore, the completed semiconductor device 200 is of a uniform gate length configuration. In some embodiments, this configuration is advantageous because the overall capacitance between the subsequently formed epitaxial source/drain features and subsequently formed gate portions is reduced and device operating speed increases. For example, Technology Computer-Aided Design (TCAD) simulations have been utilized to develop, predict, and optimize the processing. In some embodiments, the TCAD simulation results predict a reduction of total capacitance of about 0.4% in a transistor with six channel layers, each of a 5 nm channel thickness and a fin width of 8 nm, by adopting the uniform gate length configuration. In some embodiments, the TCAD simulation results predicts a reduction in total capacitance of about 1.8% in a similar transistor with four channel layers, each of a 5 nm channel thickness and a fin width of 21 nm. In the depicted embodiment, the etched semiconductor layers 210 have sidewall surfaces that align with each other and with the sidewall of the dummy gate stack 245.

In some embodiments, the etched semiconductor layers 210 have sidewall surfaces that align with each other but are offset from (i.e. do not align with) the sidewall of the dummy gate stack 245. Accordingly, the etched semiconductor layers 210 may each have a length ($L_A$, $L_B$, $L_C$, and $L_D$) that is smaller or greater than the gate length $L_t$ of the top portion.

In some embodiments, the semiconductor layers 215, while largely maintained due to its better etching resistance to the etching process, are also slightly etched. Accordingly, the suspended end portions of the semiconductor layers 215 may have a smaller thickness (along the Z direction) than their middle portions.

Figure 7:
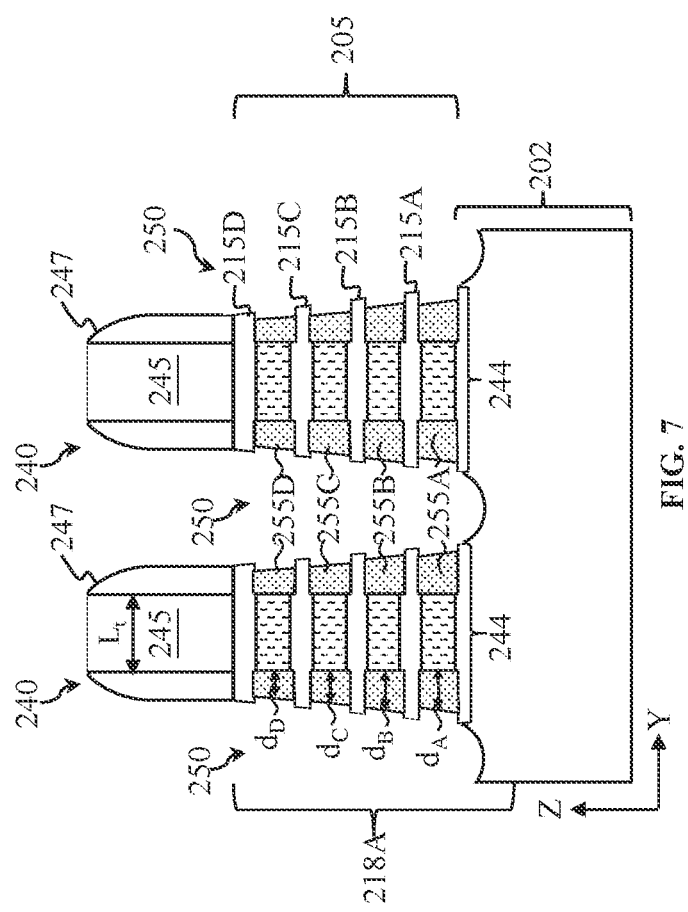

Referring to block 114 of FIG. 1 and FIG. 7, a deposition process then forms inner spacers 255 in the gaps 253 (see FIG. 6). In an embodiment, the inner spacer is formed by depositing dielectric material over gate structures 240 and over features defining source/drain trenches 250 (e.g., semiconductor layers 215, semiconductor layers 210, and substrate 202), such as by CVD, PVD, ALD, HDPCVD, MOCVD, RPCVD, PECVD, LPCVD, ALCVD, APCVD, plating, other suitable methods, or combinations thereof. The dielectric material partially (and, in some embodiments, completely) fills the source/drain trenches 250. The deposition process is configured to ensure that the dielectric material fills the gaps 253 between semiconductor layers 215 and between semiconductor layers 215 and substrate 202 under gate spacers 247. In some embodiments, a second etching process (or, an etching back process) is then performed that selectively etches the dielectric material to form the inner spacers 255 (such as inner spacers 255A, 255B, 255C, and 255D) as depicted in FIG. 7. In some embodiments, the inner spacers 255 have curved sidewall surfaces. The inner spacers 255 may have a width along the Y-direction. For example, inner spacer 255A has a width $d_A$; inner spacer 255B has a width $d_B$; inner spacer 255C has a width $d_C$; and inner spacer 255D has a width $d_D$. The widths of the inner spacers 255 generally correspond to the sizes of the removed portions of the semiconductor layers 210 that they replace. Accordingly, the inner spacers formed between the lower layers of the semiconductor layers 215 (and/or the substrate 202) have larger widths than the inner spacers formed between the upper layers of the semiconductor layers 215. For example, the width $d_A$ is greater than the width $d_B$; the width $d_B$ is greater than the width $d_C$; and the width $d_C$ is greater than the width $d_D$. In some embodiments, a ratio of the width $d_A$ to width $d_B$ is about 1.05 to about 1.7; a ratio of the width $d_B$ to width $d_C$ is about 1.05 to about 1.5; and a ratio of the width $d_C$ to width $d_D$ is about 1.05 to about 1.4.

In some embodiments, there is minimal (to no) etching of semiconductor layers 215, dummy gate stacks 245, and gate spacers 247 during the etching back of the dielectric layer. In some embodiments, the dielectric material forming the inner spacers 255 is removed from sidewalls of gate spacers 247, sidewalls of semiconductor layers 215, dummy gate stacks 245, and substrate 202. In some embodiments, the etching-back process leaves a small opening between the vertically adjacent semiconductor layers 215, such that the gaps 253 are not entirely filled with the inner spacer 255. In some embodiments, the dielectric material (and thus inner spacers 255) includes a material that is different than a material of semiconductor layers 215 and/or a material of gate spacers 247 to achieve desired etching selectivity during the second etching process. The dielectric material may include silicon, oxygen, carbon, nitrogen, other suitable material, or combinations thereof (for example, silicon oxide, silicon nitride, silicon oxynitride, silicon carbide, or silicon oxycarbonitride). In some embodiments, the dielectric material includes a low-k dielectric material, such as those described herein. In some embodiments, dopants (for example, p-type dopants, n-type dopants, or combinations thereof) are introduced into the dielectric material, such that inner spacers 255 includes a doped dielectric material.

Figure 8:
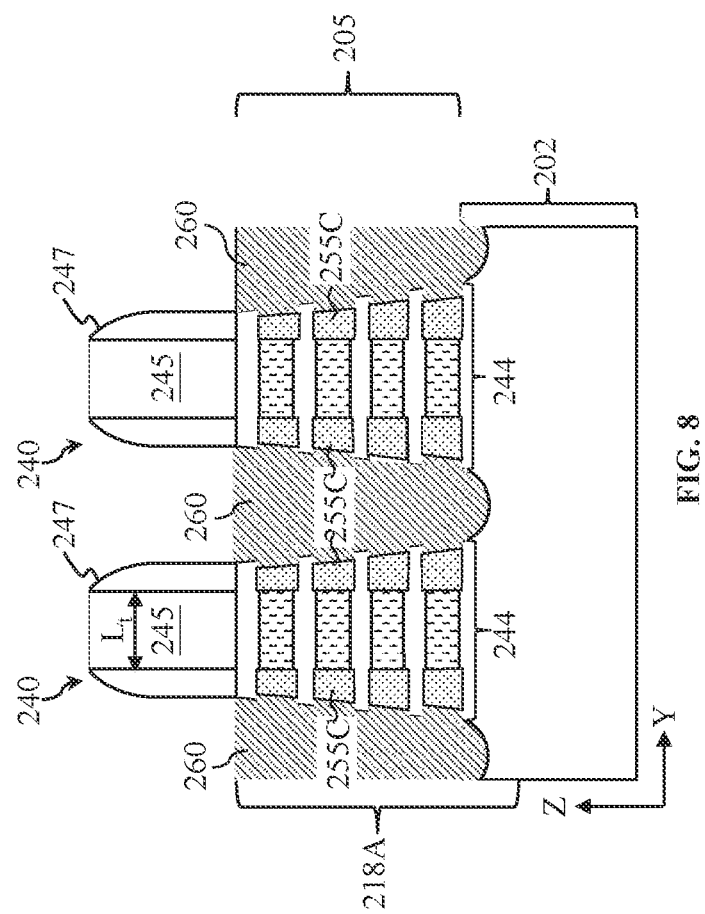

Referring to block 116 of FIG. 1 and FIG. 8, epitaxial source/drain features are formed in source/drain recesses 250. For example, a semiconductor material is epitaxially grown from a seed area of exposed portions of substrate 202 and semiconductor layers 215 exposed by source/drain recesses 250, forming epitaxial source/drain features 260 in source/drain regions 242. Suitable epitaxy processes include CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 215). The formed epitaxial source/drain features 260 directly contacts the sidewall surfaces of inner spacers 255.

Epitaxial source/drain features 260 are doped with n-type dopants and/or p-type dopants. For example, epitaxial source/drain features 260 for an n-type transistor include silicon, and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). For example, epitaxial source/drain features 260 for p-type transistors include silicon germanium or germanium and can be doped with boron, other p-type dopant, or combinations thereof (for example, forming Si:Ge:B epitaxial source/drain features). In some embodiments, epitaxial source/drain features 260 include more than one epitaxial semiconductor layer, where the epitaxial semiconductor layers can include the same or different materials and/or dopant concentrations. In some embodiments, epitaxial source/drain features 260 include materials and/or dopants that achieve desired tensile stress and/or compressive stress in respective channel regions of the device. In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260 and/or other source/drain regions (for example, heavily doped source/drain regions and/or lightly doped source/drain (LDD) regions). In some embodiments, epitaxial source/drain features 260 are formed in separate processing sequences that include, for example, masking p-type transistor regions when forming epitaxial source/drain features 260A in n-type transistor regions and masking n-type transistor regions when forming epitaxial source/drain features 260B in p-type transistor regions.

Figure 9:
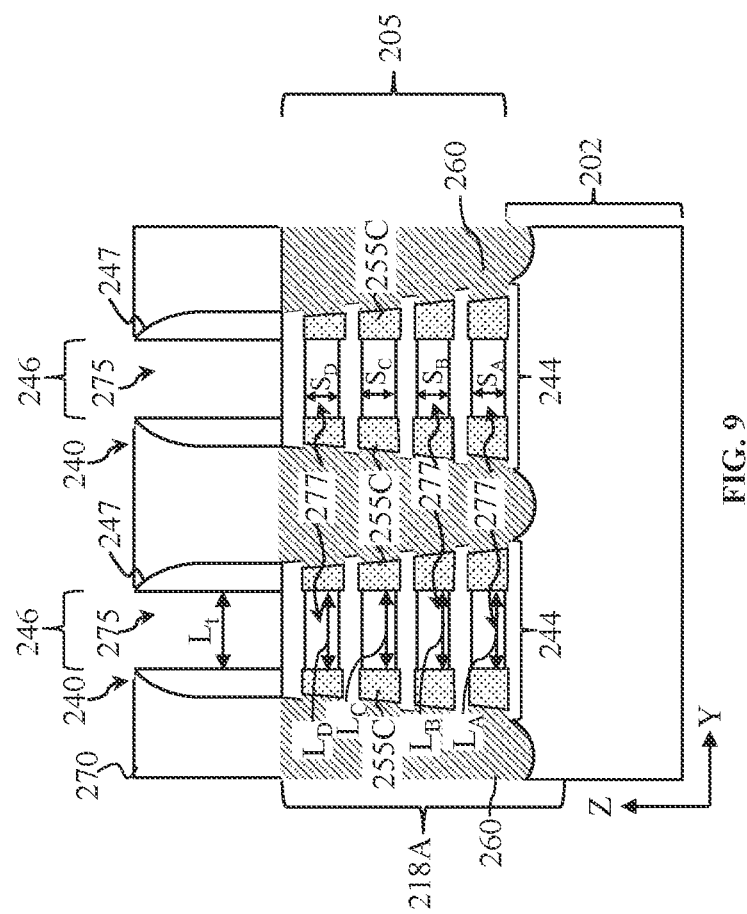

Referring to block 118 of FIG. 1 and FIG. 9, an inter-level dielectric (ILD) layer 270 is formed over isolation features 230, epitaxial source/drain features 260, and gate spacers 247, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 270 is disposed between adjacent gate structures 240. In some embodiments, ILD layer 270 is formed by a flowable CVD (FCVD) process that includes, for example, depositing a flowable material (such as a liquid compound) over device 200 and converting the flowable material to a solid material by a suitable technique, such as thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. In an embodiment, ILD layer 270 is a dielectric layer that includes a low-k dielectric material (generally referred to as a low-k dielectric layer). ILD layer 270 can include a multilayer structure having multiple dielectric materials. ILD layer 170 may be a portion of a multilayer interconnect (MLI) feature disposed over substrate 202. In some embodiments, a contact etch stop layer (CESL) is disposed between ILD layer 270 and isolation features 230, epitaxial source/drain features 260, and gate spacers 247. The CESL can include a material different than ILD layer 270, such as a dielectric material that is different than the dielectric material of ILD layer 270. For example, where ILD layer 270 includes a low-k dielectric material, the CESL includes silicon and nitrogen, such as silicon nitride or silicon oxynitride. Subsequent to the deposition of ILD layer 270 and/or the CESL, a CMP process and/or other planarization process can be performed such that a top portion (or top surface) of dummy gate stacks 245 is exposed. In some embodiments, the planarization process removes hard mask layers of dummy gate stacks 245 to expose underlying dummy gate electrodes of dummy gate stacks 245, such as polysilicon gate electrode layers.

Referring to block 120 of FIG. 1 and FIG. 9, dummy gate stacks 245 are removed from gate structures 240, thereby forming an opening over and exposing semiconductor layer stacks 205 of fins 218A, 218B. In the depicted embodiment, an etching process completely removes dummy gate stacks 245 to expose semiconductor layers 215 and semiconductor layers 210 in openings 275. The etching process is a dry etching process, a wet etching process, other suitable etching process, or combinations thereof. In some embodiments, the etching process is a multi-step etch process. For example, the etching process may alternate etchants to separately remove various layers of dummy gate stacks 245, such as the dummy gate electrode layers, the dummy gate dielectric layers, and/or the hard mask layers. In some embodiments, the etching process is configured to selectively etch dummy gate stacks 245 with minimal (to no) etching of other features of device 200, such as ILD layer 270, gate spacers 247, isolation features 230, semiconductor layers 215, and/or semiconductor layers 210. In some embodiments, a lithography process, such as those described herein, is performed to form a patterned mask layer that covers ILD layer 270 and/or gate spacers 247, and the etching process uses the patterned mask layer as an etch mask.

Referring to block 122 of FIG. 1 and FIG. 9, semiconductor layers 210 of semiconductor layer stack 205 (exposed by gate openings 275) are selectively removed from intermediate regions 244, thereby forming suspended semiconductor layers 215 in channel regions 246 (which is part of the intermediate regions 244). In the depicted embodiment, an etching process selectively etches semiconductor layers 210 with minimal etching of semiconductor layers 215 and, in some embodiments, minimal (to no) etching of gate spacers 247 and/or inner spacers 255. The etching process is a dry etching process, a wet etching process, other suitable etching process, or combinations thereof. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 (in the depicted embodiment, silicon) (i.e., the etchant has a high etch selectivity with respect to the material of semiconductor layers 210). In some embodiments, a dry etching process (such as an RIE process) utilizes a fluorine-containing gas (for example, $SF_6$) to selectively etch semiconductor layers 210. In some embodiments, a ratio of the fluorine-containing gas to an oxygen-containing gas (for example, $O_2$), an etching temperature, and/or an RF power may be tuned to selectively etch silicon germanium. In some embodiments, a wet etching process utilizes an etching solution that includes ammonium hydroxide ($NH_4OH$) and water ($H_2O$) to selectively etch semiconductor layers 210. In some embodiments, a chemical vapor phase etching process using hydrochloric acid (HCl) selectively etches semiconductor layers 210. In some embodiments, a minimal (to none) portion of the semiconductor layers 215 is also etched.

Suspended semiconductor layers 215 are thus exposed in openings 275. In the depicted embodiment, four suspended semiconductor layers 215 are vertically stacked and exposed in the channel region and will provide four channels through which current will flow between respective epitaxial source/drain features during operation of the transistors. Suspended semiconductor layers 215 are thus referred to as channel layers 215 hereinafter. Channel layers 215 are vertically separated from each other and from the substrate 202 by gaps 277. The gaps 277 may each have a vertical spacing along the Z-direction. For example, gap 277 between the substrate 202 and the semiconductor layers 215A has a spacing $S_A$; gap 277 between the semiconductor layer 215A and semiconductor layer 215B has a spacing $S_B$; gap 277 between the semiconductor layer 215B and semiconductor layer 215C has a spacing $S_C$; and gap 277 between the semiconductor layer 215C and semiconductor layer 215D has a spacing $S_D$. The sizes of $S_A$, $S_B$, $S_C$, and $S_D$ are largely determined by the thicknesses of the semiconductor layers 210 that once occupy the gaps 277. The thickness of the semiconductor layer 210 has been discussed above with reference to block 104 of FIG. 1 and FIG. 2B. In the depicted embodiments, the semiconductor layers 215 are slightly etched during the removal of the semiconductor layers 210. Accordingly, the spacings $S_A$, $S_B$, $S_C$, and $S_D$ are larger than the thicknesses $t_{1A}$, $t_{1B}$, $t_{1C}$, and $t_{1D}$ of the corresponding semiconductor layers 210, such as about 10% to about 100% larger depending on the initial thickness of the semiconductor layer 215. Spacing $S_A$, $S_B$, $S_C$, and $S_D$ may be about equal to each other. Though as described later, these spacings may be different.

In some embodiments, lengths of the gaps 277 along the Y-direction are defined by the lengths of the semiconductor layers 210 after the etching of their end portions (see FIG. 6). Accordingly, lengths of the gaps 277 formed by removing semiconductor layers 210A, 210B, 210C, and 210D are $L_A$, $L_B$, $L_C$, and $L_D$, respectively. In the depicted embodiment, $L_A$, $L_B$, $L_C$, and $L_D$ are about the same as each other and are about the same as $L_t$. In some embodiments, lengths $L_A$, $L_B$, $L_C$, $L_D$ and $L_t$ are about 5 nm to about 200 nm. As described above, in some embodiments, lengths $L_A$, $L_B$, $L_C$, $L_D$ may be smaller or greater than length $L_t$, and may be about 3 nm to about 200 nm. The process depicted in FIG. 9 can be referred to as a channel release process. In some embodiments, after removing semiconductor layers 210, an etching process is performed to modify a profile of channel layers 215 to achieve desired dimensions and/or desired shapes. As a result, the thicknesses of the channel layers 215 may be reduced.

Figure 10:
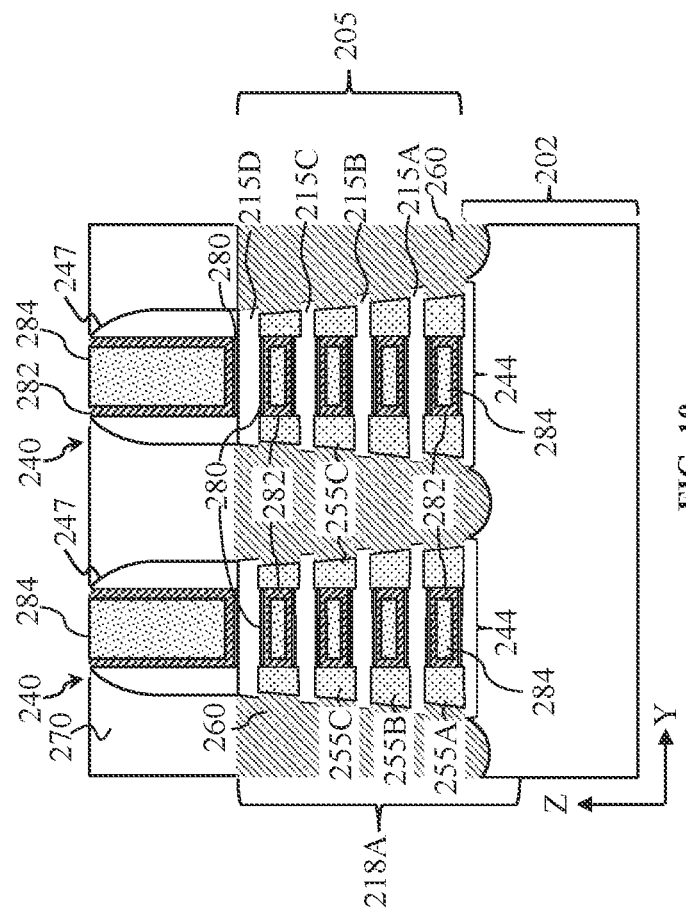
Figure 11:
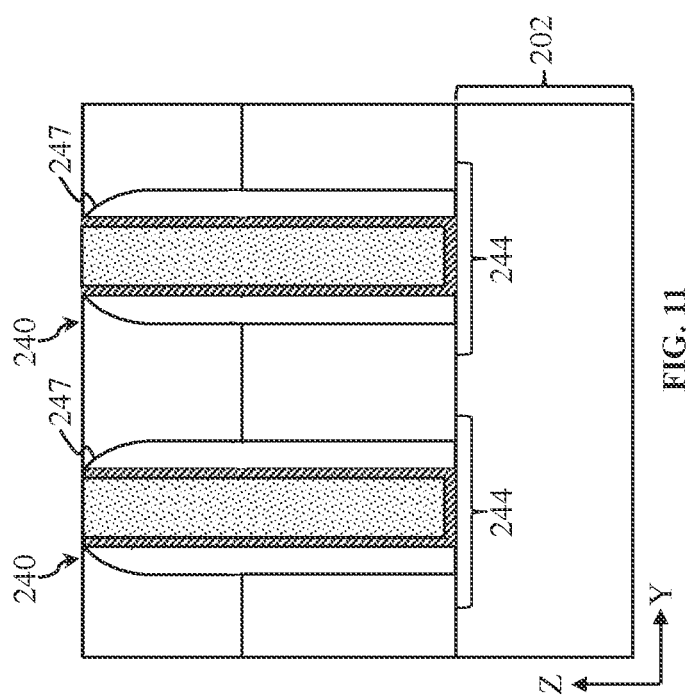
Figure 12A:
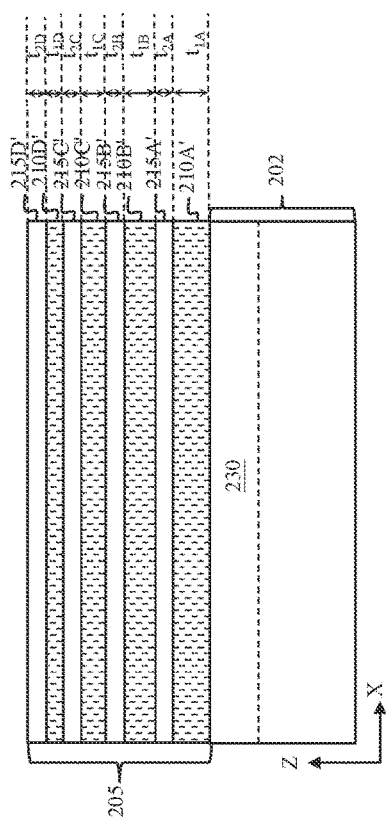
Figure 12B:
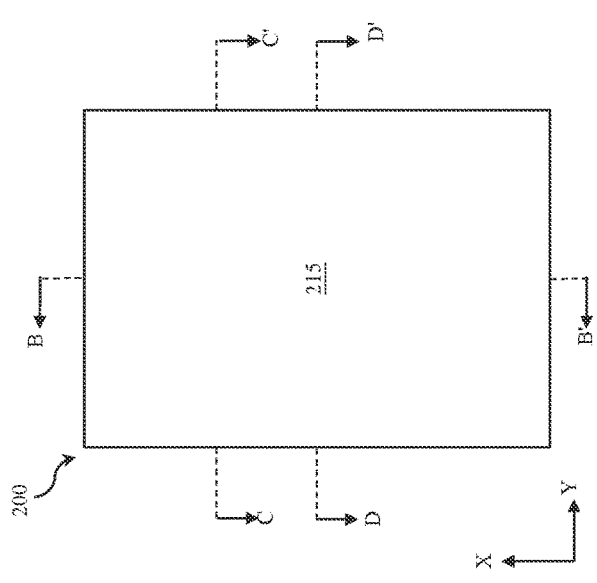
Figure 12C:
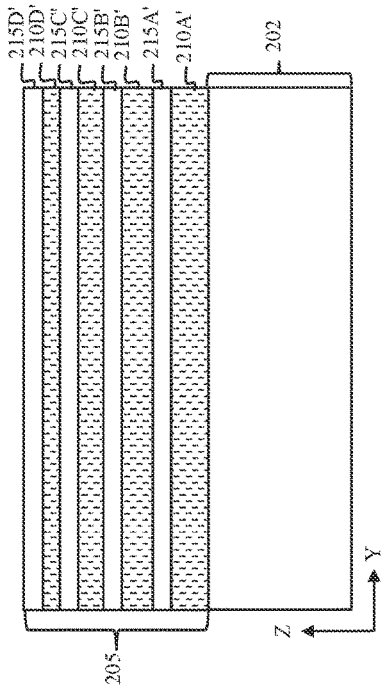
Figure 12D:
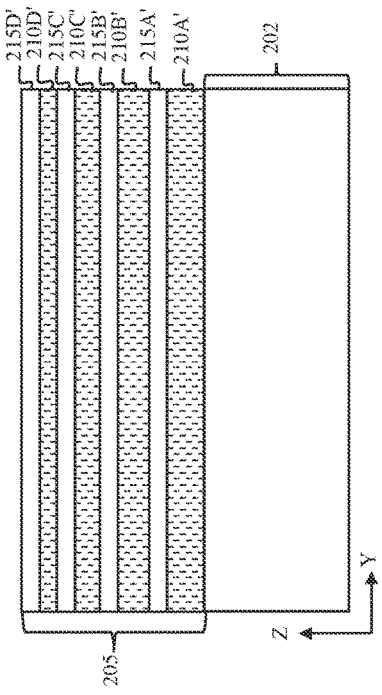
Figure 13A:
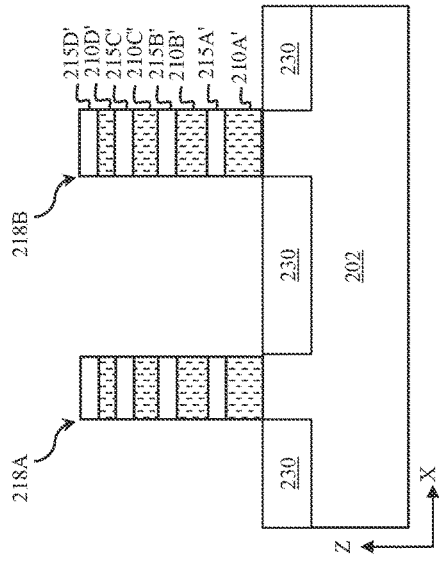
Figure 13B:
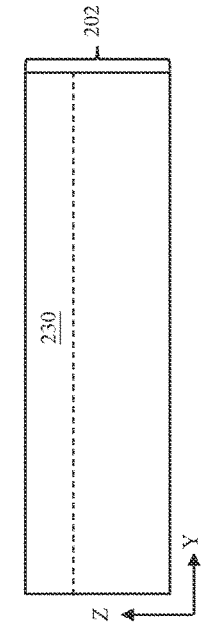
Figure 13C:
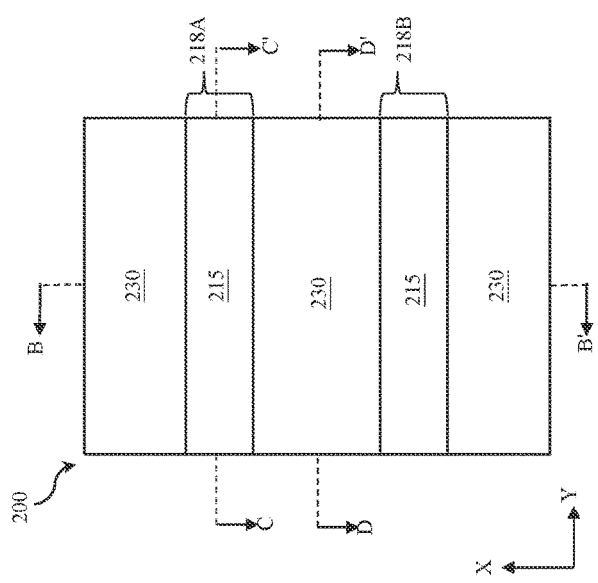
Figure 13D:
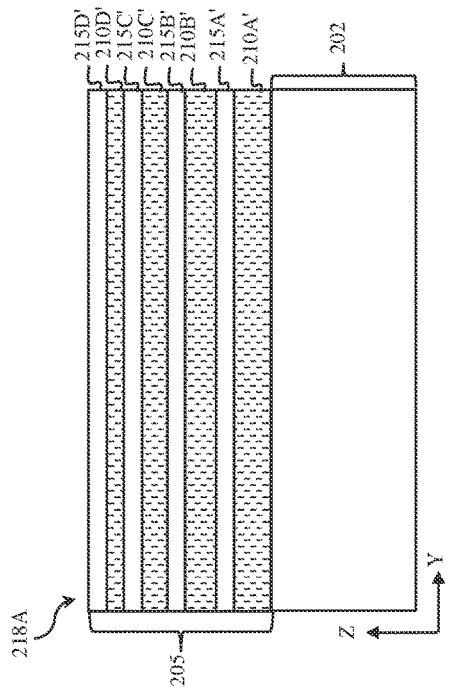

Referring to block 124 of FIG. 1 and FIGS. 10 and 11, a gate dielectric layer is formed over device 200, where the gate dielectric layer partially fills gate openings 275 and wraps (surrounds) channel layers 215. In the depicted embodiment, the gate dielectric layer includes an interfacial layer 280 and a high-k dielectric layer 282, where interfacial layer 280 is disposed between the high-k dielectric layer 282 and channel layers 215. In furtherance of the depicted embodiment, interfacial layer 280 and high-k dielectric layer 282 partially fill gaps 277 (see FIG. 9) between channel layers 215 and between channel layers 215 and substrate 202. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-comprising dielectric material, other suitable dielectric material, or combinations thereof. High-k dielectric layer 282 includes a high-k dielectric material, such as $HfO_2$, HfSiO, $HfSiO_4$, HfSiON, HfLaO, HfTaO, HfSiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$ (BTO), (Ba,Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm.

Referring to block 126 of FIG. 1 and FIGS. 10 and 11, a gate electrode layer 284 is formed over device 200, particularly over high-k dielectric layer 282. For example, an ALD process conformally deposits the gate electrode layer 284 on high-k dielectric layer 282, such that gate electrode layer 284 completely fills gate openings 275, including the remaining portions of gaps 277. For example, gate electrode layer 284 is disposed along sidewalls, tops, and bottoms of channel layers 215. A thickness of gate electrode layer 284 is configured to fill any remaining portions of gaps 277 between channel layers 215 and between channel layers 215 and substrate 202. In some embodiments, the gate electrode layers 284 may include work function layers. For example, a p-type work function layer may be formed in an n-type doped region for a p-type device, and an n-type work function layer may be formed in a p-type doped region for an n-type device. The work function layers may be formed conformally over and between the high-k dielectric layers 282 and have a thickness of about 1 nm to about 10 nm. P-type work function layer includes any suitable p-type work function material, such as TiN, TaN, TaSN, Ru, Mo, Al, WN, WCN ZrSi$_2$, MoSi$_2$, TaSi$_2$, NiSi$_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In some embodiments, the gate electrode layers 284 may include a metal fill (or bulk) layer formed over device 200, particularly over p-type and n-type work function layers. For example, a CVD process or a PVD process deposits metal fill layer on work function layers such that metal fill layer fills any remaining portion of gate openings 275, including any remaining portions of gaps 277. Metal fill layer includes a suitable conductive material, such as Al, W, and/or Cu. Metal fill layer may additionally or collectively include other metals, metal oxides, metal nitrides, other suitable materials, or combinations thereof. Alternatively, metal fill layer and/or the work function layer can be formed using any suitable deposition process, such as ALD, CVD, PVD, HDPCVD, MOCVD, RPCVD, PECVD, LPCVD, ALCVD, APCVD, spin coating, plating, other deposition process, or combinations thereof. A planarization process is performed to remove excess gate materials from device 200. For example, a CMP process is performed until a top surface of ILD layer 270 is reached (exposed), such that a top surface of gate structures 240 are substantially planar with a top surface of ILD layer 270 after the CMP process.

Fabrication can proceed to complete the device 200. For example, various contacts can be formed to facilitate operation of the n-type transistors and the p-type transistors. For example, one or more ILD layers, similar to ILD layer 270, and/or CESL layers can be formed over substrate 202 (in particular, over ILD layer 270 and gate structures 240). Contacts can then be formed in ILD layer 270. For example, contacts are respectively electrically and/or physically coupled with gate structures 240 and contacts are respectively electrically and/or physically coupled to source/drain regions of the transistors (particularly, epitaxial source/drain features 260). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 270 and the contacts (for example, extending through ILD layer 270 and/or the other ILD layers) are a portion of the MLI feature described above. MLI features include ILD layers with interposing metallization lines and vias to route signals including to and from the gate structures 240 and epitaxial source/drain features 260.

As shown above, FIGS. 2A-2D, 3A-3D, 4A-4D, and 5-11 illustrate an embodiment where the semiconductor layers 210A, 210B, 210C, and/or 210D are configured to have different constituent atomic percentages in order to achieve the desired cascade of removal (e.g., etching) rates. As indicated above, the etch rate differences of the method 100 may alternatively, or additionally, be achieved by selecting proper layer thicknesses for each layer of the semiconductor layers 210. FIGS. 12A-12D, 13A-13D, 14A-14D, and 15-21 illustrate an embodiment where the semiconductor layers 210A, 210B, 210C, and/or 210D are configured to have different layer thicknesses. This embodiment shares many similar structural features and/or fabrication steps as that described in detail above with respect to FIGS. 2A-2D, 3A-3D, 4A-4D, and 5-11. Accordingly, many descriptions are abbreviated and simplified, and reference numerals are repeated for the sake of simplicity and clarity.

Referring to blocks 102-104 of FIG. 1 and FIGS. 12A-12D, a semiconductor substrate 202 is received. A semiconductor layer stack 205 is formed over substrate 202. The semiconductor layer stack 205 includes semiconductor layers 210 and semiconductor layers 215 stacked vertically in an interleaving or alternating configuration from a surface of substrate 202. A composition of semiconductor layers 210 is different than a composition of semiconductor layers 215 such that etching selectivity is achieved during subsequent processing. This generally resembles that described above with respect to FIGS. 2A-2D. In an embodiment, each layer of the semiconductor layers 210 (such as semiconductor layers 210A', 210B', 210C', and 210D') has a different thickness along the Z-direction from one another. As explained in more detail below with respect to FIGS. 16 and 23, this variation in layer thickness (rather than or in addition to any variation in constituent atomic percentages as described above with respect to FIGS. 2A-2D, 6, and 22) results in etch rate differences between each of semiconductor layers 210, and allows the gate channel lengths to be controlled for the purpose of improving device performances. In some embodiments, the semiconductor layer 210A' may have a greater thickness ($t_{1A}$) than the semiconductor layer 210B' ($t_{1B}$), for example, by about 5% to about 50%. In some embodiments, the semiconductor layer 210B' may have a greater thickness ($t_{1B}$) than the semiconductor layer 210C' ($t_{1C}$), for example, by about 5% to about 50%. In some embodiments, the semiconductor layer 210C' may have a greater thickness ($t_{1C}$) than the semiconductor layer 210D' ($t_{1D}$), for example, by about 5% to about 50%. The semiconductor layers 215 (such as semiconductor layers 215A', 215B', 215C', and 215D') may each have a same or different thicknesses $t_{2A}$, $t_{2B}$, $t_{2C}$, and $t_{2D}$, respectively, based on design requirements and/or to achieve desired performance of device 200. In some embodiments, thicknesses $t_{1A}$-$t_{1D}$ and thicknesses $t_{2A}$-$t_{2D}$ are each about 1 nm to about 10 nm, similar to that discussed above with reference to FIGS. 2A-2D.

Referring to block 106 of FIG. 1 and FIGS. 13A-13D, semiconductor layer stack 205 is patterned to form a fin 218A and a fin 218B in a way similar to that described above with respect to FIGS. 3A-3D. Accordingly, fins 218A, 218B include a portion of the semiconductor layer stack 205 that includes semiconductor layers 210 each having the different thicknesses $t_{1A}$, $t_{1B}$, $t_{1C}$, and $t_{1D}$. An isolation feature(s) 230 is formed over and/or in substrate 202 to separate and isolate fins 218A, 218B from each other, and from other active device regions (such as fins) and/or passive device regions.

Referring to block 108 of FIG. 1 and FIGS. 14A-14D, gate structures 240 (or dummy gate structures 240) are formed over portions of fins 218A, 218B and over isolation features 230 in a configuration similar to that already described with respect to FIGS. 4A-4D. The gate structure defines source/drain regions 242 and intermediate regions 244 between the source/drain regions. Each gate structure 240 includes a dummy gate stack 245. The dummy gate stacks 245 has a width that defines a gate length ($L_t$) in the Y-direction of a top gate portion of gate structure 240. The dummy gate stacks 245 include a dummy gate electrode, and in some embodiments a gate dielectric.

Figure 15:
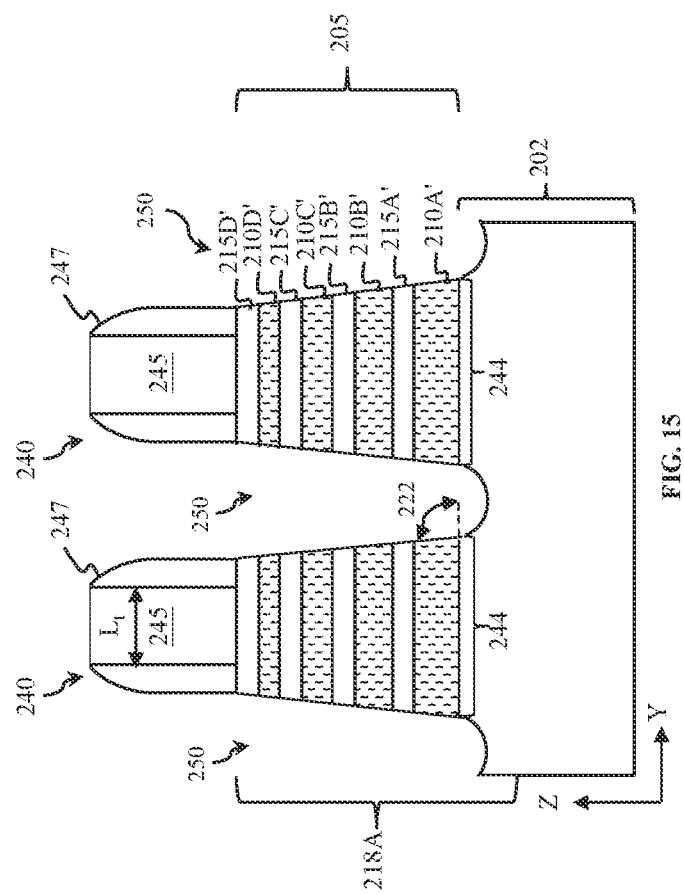

Referring to block 110 of FIG. 1 and FIG. 15, exposed portions of fins (such as source/drain regions 242 of fin 218A that are not covered by gate structures 240) are at least partially removed to form source/drain trenches (recesses) 250. Similar to that illustrated in FIG. 5, the source/drain trenches 250 here also have canted sidewall surfaces, for example, that each spans an angle 222 from a X-Y plane (for example, an angle of about 90° to about 105°). Accordingly, length $l_A$ of semiconductor layer 210A' is greater than $l_B$ of semiconductor layer 210B'; length $l_B$ is greater than $l_C$ of semiconductor layer 210C', and length $l_C$ is greater than $l_D$ of semiconductor layer 210D'. In some embodiments, a ratio of length $l_A$ to length $l_B$ is about 0.9 to 1.0; a ratio of length $l_B$ to length $l_C$ is about 0.9 to 1.0; and a ratio of length $l_C$ to length $l_D$ is about 0.9 to 1.0. In some embodiments, these ratios may be adjusted depending on profile tuning.

Figure 16:
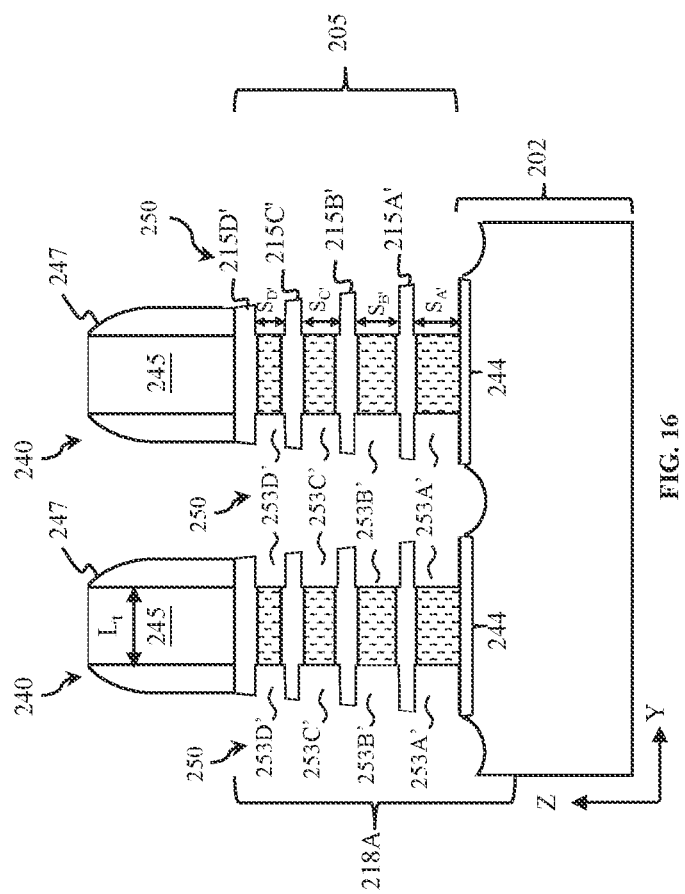
Figure 23:
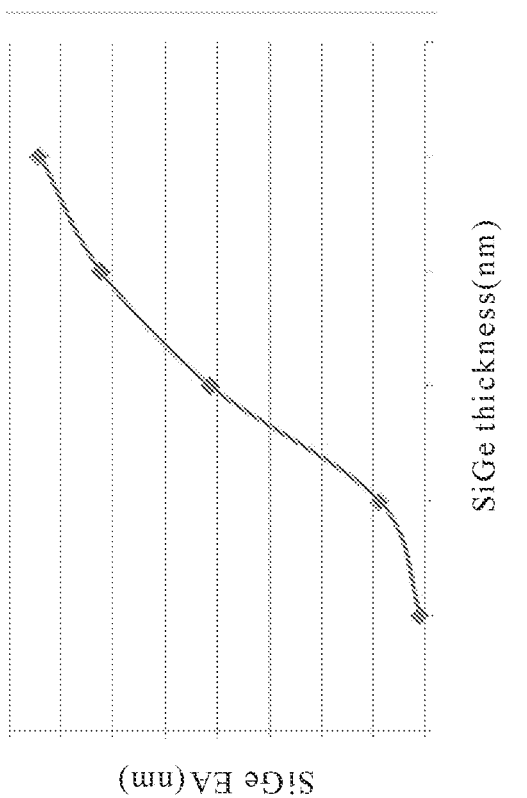
FIG. 23 is a graph illustrating an effect of layer thickness on the removal rate of the semiconductor layer.

Referring to block 112 of FIG. 1 and FIG. 16, gaps 253 (such as gaps 253A', 253B', 253C', and 253D') are formed in intermediate regions 244 by selectively removing end portions of the semiconductor layers 210 without substantially etching the semiconductor layers 215. Accordingly, end portions (edges) of semiconductor layers 215 are suspended in the intermediate regions 244 under gate spacers 247. Moreover, the lengths $l_A$, $l_B$, $l_C$, and $l_D$ of semiconductor layers 210A', 210B', 210C', and 210D' are reduced to $L_A$, $L_B$, $L_C$, and $L_D$, respectively. In an embodiment, this process occurs concurrently. Similar to what has already been described above with respect to FIG. 6, the reduced lengths $L_A$, $L_B$, $L_C$, and $L_D$ each define the gate length of a gate portion subsequently formed in this region of the semiconductor layers 210A', 210B', 210C', or 210D'. Therefore, for the purpose of achieving uniform gate lengths, it is necessary to remove a larger portion of the semiconductor layer 210A' (corresponding to the length difference $l_A$–$L_A$) than that of the semiconductor layer 210B' (corresponding to the length difference $l_B$–$L_B$); a larger portion of the semiconductor layer 210B' (corresponding to the length difference $l_B$–$L_B$) than that of the semiconductor layer 210C' (corresponding to the length difference $l_C$–$L_C$); and a larger portion of the semiconductor layer 210C' (corresponding to the length difference $l_C$–$L_C$) than that of the semiconductor layer 210D' (corresponding to the length difference $l_D$–$L_D$). In order to remove the relatively larger portions concurrently with the relatively smaller portions, it is necessary for the bottom layers of the semiconductor layers 210 to have higher etch rates than the top layers of the semiconductor layers 210. For example, there may be a decreasing cascade of etch rates from the semiconductor layers 210A', the semiconductor layer 210B', the semiconductor layer 210C', to the semiconductor layer 210D'. In the present embodiment, this decreasing cascade of etch rates here is accomplished (at least in part) by configuring the semiconductor layers 210A', 210B', 210C', and 210D' to have different layer thicknesses. As described above with respect to block 104 of FIG. 1 and FIGS. 12A-12D, the different layer thicknesses result in different removal rates for each of the semiconductor layers 210 (e.g., due to the height of the exposed sidewall of the semiconductor layers 210A', 210B', 210C', and 210D'). In some embodiments, the necessary layer thicknesses may be determined experimentally from the sidewall profile of the source/drain trenches 250, the desired uniform gate lengths, and the relationship function between the layer thicknesses, the etch rates, and the chosen etching chemical. An exemplary relationship function between the layer thicknesses and the etch rates is illustrated in FIG. 23. Silicon germanium (SiGe) layers with different layer thicknesses are removed at a different rate when they are subjected to the same etching chemicals, such as Chemical 6. A smaller layer thickness generally leads to a lower removal rate of the SiGe layer in the chemical etchants. In some embodiments, by increasing the layer thickness by a factor of about 2, the removal rate increases by a factor of about 6. Accordingly, the proper layer thickness for each layer of semiconductor layers 210 may be determined, before forming the semiconductor layer stack 205, at least partially based on FIG. 23.

Accordingly, the semiconductor layers 210A' has a greater removal amount in the etching chemical than that of the semiconductor layer 210B' such that the removed end portions of the semiconductor 210A' (corresponding to the length difference $l_A$–$L_A$) are of a greater size than the removed end portions of the semiconductor layer 210B' (corresponding to the length difference $l_B$–$L_B$) during the same, concurrent etching process. Similarly, the semiconductor layers 210B' has a greater removal amount in the etching chemical than that of the semiconductor layer 210C' such that the removed end portions of the semiconductor 210B' are of a greater size than the removed end portions of the semiconductor layer 210C'; and the semiconductor layers 210C' has a greater removal amount than that of the semiconductor layer 210D' such that the removed end portions of the semiconductor 210C' are of a greater size than the removed end portions of the semiconductor layer 210D'. By selecting the layer thickness of the semiconductor layers 210A', 210B', 210C', and 210D' based on the necessary removal amounts, the lengths $L_A$, $L_B$, $L_C$, and $L_D$ of the etched semiconductor layers 210A', 210B', 210C', and 210D' may be rationally controlled such that they are substantially the same as one another. In the depicted embodiment, $L_A$, $L_B$, $L_C$, and $L_D$ are each about equal to the gate length $L_t$. The lengths $L_A$, $L_B$, $L_C$, and $L_D$, as well as the length $L_t$, each define a gate length of a gate portion of gate structure 240. Therefore, the completed semiconductor device 200 is of a uniform gate length configuration. As already described above with respect to FIG. 6, uniform gate length configuration is advantageous because the overall capacitance between the subsequently formed epitaxial source/drain features and subsequently gate portions is reduced and device operating speed increases. Moreover, in some embodiments, the etched semiconductor layers 210 have sidewall surfaces that align with each other and with the sidewall of the dummy gate stack 245.

As illustrated in FIG. 16, the gaps 253 each has a height $S_A'$, $S_B'$, $S_C'$, and $S_D'$, respectively, that is different from one another. The heights $S_A'$, $S_B'$, $S_C'$, and $S_D'$ generally corresponds to the thicknesses $t_{1A}$, $t_{1B}$, $t_{1C}$, and $t_{1D}$ of the end portions of the semiconductor layers 210 that is removed. In some embodiments, semiconductor layers 215 are subject to a minimal amount of etching. Accordingly, the heights $S_A'$, $S_B'$, $S_C'$, and $S_D'$ may be slightly (such as less than 10%) greater than the thicknesses $t_{1A}$, $t_{1B}$, $t_{1C}$, and $t_{1D}$. In some embodiments, the height $S_A'$ may be greater than $S_B'$, for example, by about 5% to about 30%. In some embodiments, the height $S_B'$ may be greater than $S_C'$, for example, by about 5% to about 30%. In some embodiments, the height $S_C'$ may be greater than $S_D'$, for example, by about 5% to about 30%.

Figure 17:
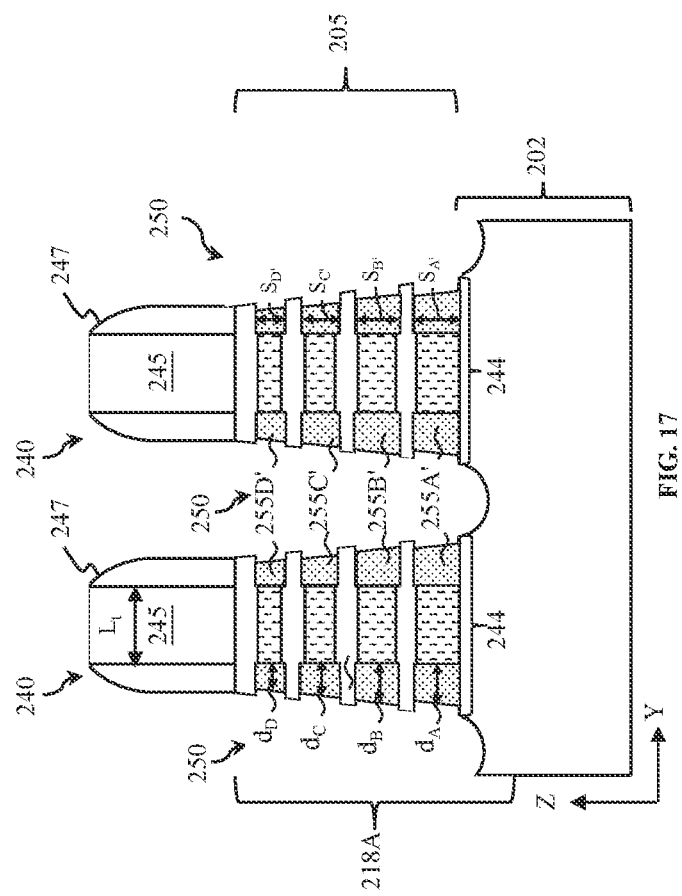

Referring to block 114 of FIG. 1 and FIG. 17, a deposition process and an etch-back process are employed to form inner spacers 255 in the gaps 253. The inner spacers 255 (such as inner spacers 255A', 255B', 255C', and 255D') have different widths as illustrated in FIG. 17. Similar to that described with respect to FIG. 7, the widths of the inner spacers 255 generally correspond to the sizes of the portions of the semiconductor layers 210 that they replace. Accordingly, width $d_A$ of inner spacer 255A' is greater than width $d_B$ of inner spacer 255B'; width $d_B$ is greater than $d_C$ of inner spacer 255C'; and width $d_C$ is greater than width $d_D$ of inner spacer 255D'. In some embodiments, a ratio of the width $d_A$ to width $d_B$ is about 1.05 to about 1.7; a ratio of the width $d_B$ to width $d_C$ is about 1.05 to about 1.5; and a ratio of the width $d_C$ to width $d_D$ is about 1.05 to about 1.3. Moreover, as described above, the inner spacers 255A', 255B', 255C', and 255D' have heights corresponding to the heights $S_A'$, $S_B'$, $S_C'$, and $S_D'$ of the gaps 253. Accordingly, inner spacers 255A' has greater thickness and greater width than inner spacers 255B'; inner spacers 255B' has greater thickness and greater width than inner spacers 255C'; and inner spacers 255C' has greater thickness and greater width than inner spacers 255D'.

Figure 18:
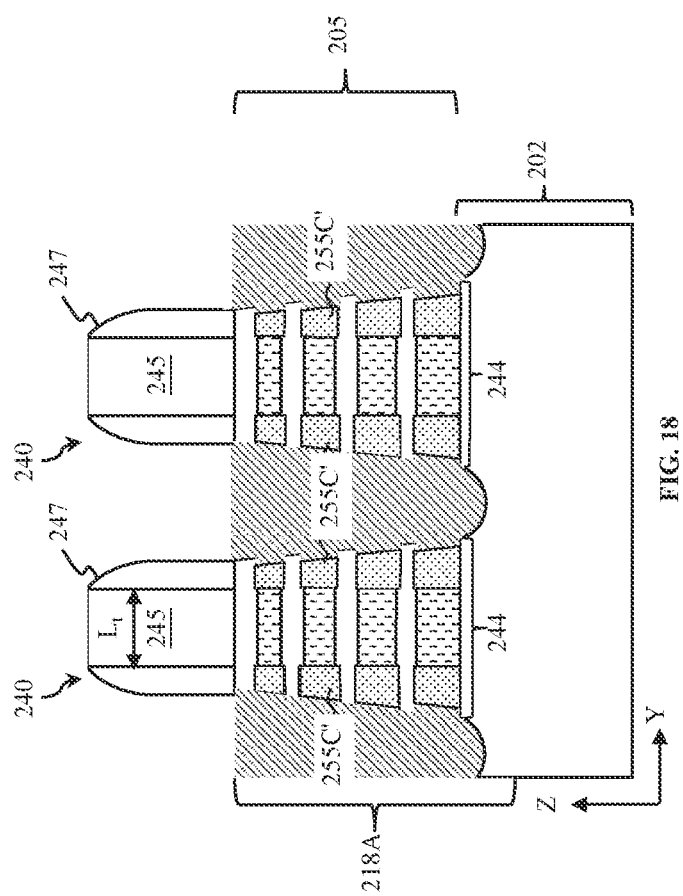
Figure 19:
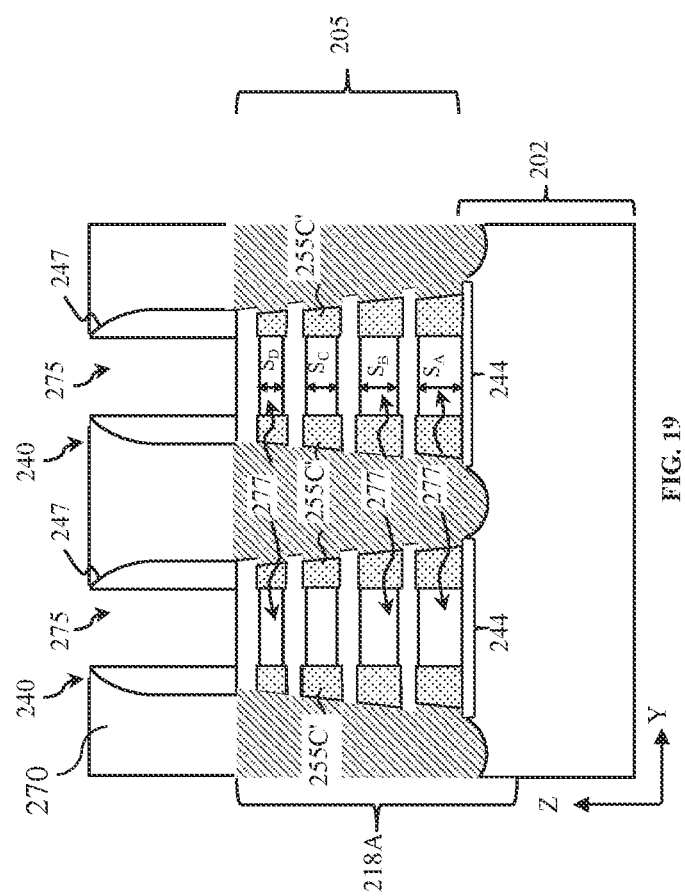

Referring to blocks 116-122 of FIG. 1 and FIGS. 18-19, epitaxial source/drain features 260 are formed in source/drain recesses 250. Epitaxial source/drain features 260 are doped with n-type dopants and/or p-type dopants. An ILD layer 270 is formed over isolation features 230, epitaxial source/drain features 260, and gate spacers 247. Dummy gate stacks 245 are removed from gate structures 240, thereby exposing semiconductor layer stacks 205 of fins 218A, 218B in openings 275. The semiconductor layers 210 of semiconductor layer stack 205 (exposed by gate openings 275) are selectively removed, thereby forming suspended semiconductor layers 215 in channel regions 246 (which is part of the intermediate regions 244) and exposed in openings 275. Channel layers 215 are vertically separated from each other and from the substrate 202 by gaps 277. The sizes $S_A$, $S_B$, $S_C$, and $S_D$ of gaps 277 are largely determined by the thicknesses $t_{1A}$, $t_{1B}$, $t_{1C}$, and $t_{1D}$ of the semiconductor layers 210 that once occupy the gaps 277. The thicknesses of the semiconductor layers 210 have been discussed above with reference to block 104 of FIG. 1 and FIG. 12B. In the depicted embodiments, the semiconductor layers 215 are slightly etched during the removal of the semiconductor layers 210. Accordingly, the spacings $S_A$, $S_B$, $S_C$, and $S_D$ are larger than the thicknesses $t_{1A}$, $t_{1B}$, $t_{1C}$, and $t_{1D}$ of the corresponding semiconductor layers 210, such as about 10% to about 100% larger depending on the initial thickness of the semiconductor layer 215. Accordingly, the spacing $S_A$ is greater than $S_B$; the spacing $S_B$ is greater than $S_C$; and the spacing $S_C$ is greater than $S_D$. In some embodiments, the spacing $S_A$ is substantially the same as the spacing $S_A'$; the spacing $S_B$ is substantially the same as the spacing $S_B'$; the spacing $S_C$ is substantially the same as the spacing $S_C'$; and the spacing $S_D$ is substantially the same as the spacing $S_D'$.

As illustrated in FIG. 19, the gaps 277 each has a length $L_A$, $L_B$, $L_C$, and $L_D$, respectively. In the depicted embodiment, $L_A$, $L_B$, $L_C$, and $L_D$ are about the same as each other and are about the same as $L_t$. In some embodiments, lengths $L_A$, $L_B$, $L_C$, $L_D$ and $L_t$ are about 5 nm to about 200 nm. As described above, in some embodiments, lengths $L_A$, $L_B$, $L_C$, $L_D$ may be smaller or greater than length $L_t$, and may be about 3 nm to about 200 nm.

Figure 20:
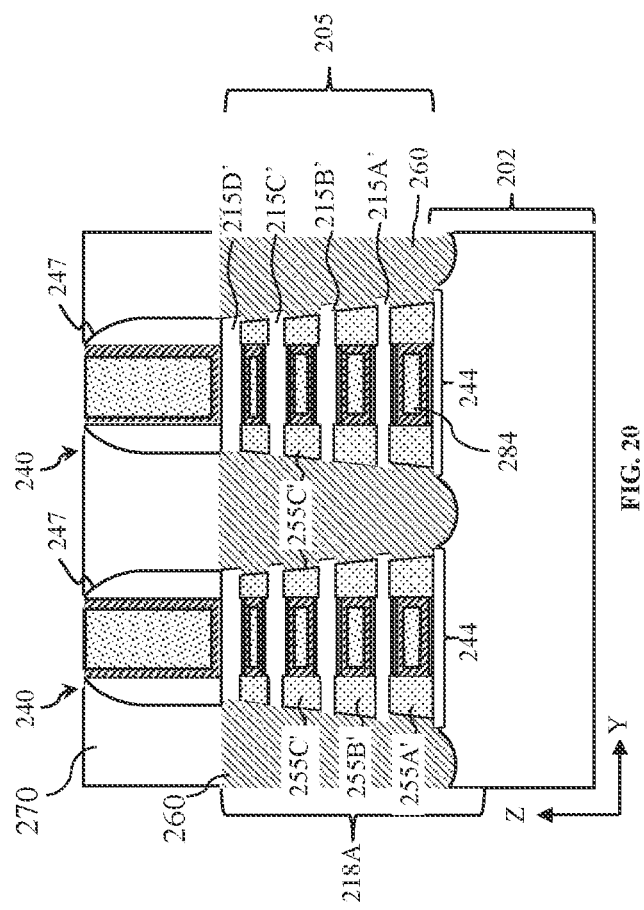
Figure 21:
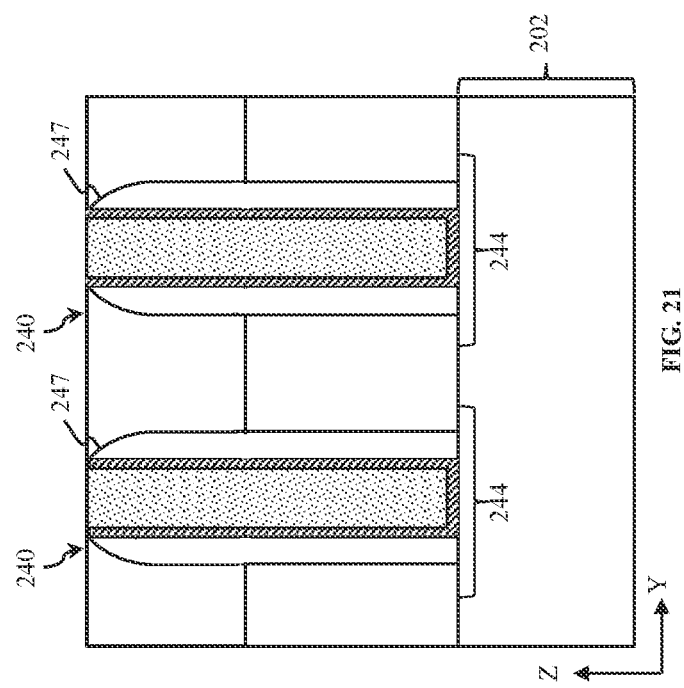

Referring to blocks 124-126 of FIG. 1 and FIGS. 20 and 21, a gate dielectric layer is formed over device 200 and wraps (surrounds) channel layers 215. The gate dielectric layer includes an interfacial layer 280 and a high-k dielectric layer 282, where interfacial layer 280 is disposed between the high-k dielectric layer 282 and channel layers 215. A gate electrode layer 284 is formed over the high-k dielectric layer 282. A planarization process is performed to remove excess gate materials from device 200 and expose a top surface of the ILD 270. One or more ILD layers, CESL layers, and contacts are then formed to complete the device 200, in a way substantially similar to those described above.

While the above discussions of embodiment focus on the semiconductor layers 210 each having a different constituent atomic percentage or a different layer thicknesses, in some embodiments, the semiconductor layers 210 may be configured to have both different constituent atomic percentages and different layer thicknesses.

Though not intended to be limiting, embodiments of the present disclosure offer benefits for semiconductor processing and semiconductor devices. For example, the disclosed methods allow different gate portions of a nano-sheet-based device to have similar or substantially the same gate lengths. The uniform gate lengths reduce the capacitance and increase the operation speed of the device. Different embodiments may have different benefits. Not all benefits are necessary for any embodiments.

In an exemplary aspect, the present disclosure is directed to a semiconductor device. The semiconductor device includes a semiconductor substrate having a top surface; a first source/drain feature and a second source/drain feature over the semiconductor substrate; a first suspended channel layer over the semiconductor substrate, a second suspended channel layer over the first suspended channel layer, and a third suspended channel layer over the second suspended channel layer. The first, the second, and the third suspended channel layers each extends in parallel to the top surface and each connects the first and the second source/drain features along a first direction parallel to the top surface. The semiconductor device also includes a first gate portion between the first and the second suspended channel layers, and a second gate portion between the second and the third suspended channel layers. The semiconductor device further includes a first inner spacer between the first and the second suspended channel layers and between the first gate portion and the first source/drain feature, and a second inner spacer between the second and the third suspended channel layers and between the second gate portion and the first source/drain feature. The first and the second gate portions each has a gate length along the first direction that is substantially the same as each other. Moreover, the first inner spacer has a first width along the first direction, the second inner spacer has a second width along the first direction, and the second width is smaller than the first width.

In some embodiments, the first and the second gate portions each has a sidewall extending along a second direction orthogonal to the top surface of the semiconductor substrate, and the sidewalls aligned along the second direction. In some embodiments, the first inner spacer has a first thickness along a second direction perpendicular to the top surface, the second inner spacer has a second thickness along the second direction, and the second thickness is smaller than the first thickness. In some embodiments, the semiconductor device further includes a third inner spacer. The third inner spacer has a third width greater than the first width. In some embodiments, the first inner spacer has a first thickness along a second direction perpendicular to the top surface, the second inner spacer has a second thickness along the second direction, and the third inner spacer has a third thickness along the second direction. The third thickness is greater than the first thickness, and the first thickness is greater than the second thickness. In some embodiments, the first gate portion has a fourth thickness along a third direction orthogonal to the top surface, the second gate portion has a fifth thickness along the third direction, and the fifth thickness is smaller than the fourth thickness.

In an exemplary aspect, the present disclosure is directed to a method. The method includes receiving a structure of a semiconductor device. The structure includes a stack of a first semiconductor layer over a semiconductor substrate, a second semiconductor layer over the first semiconductor layer, and a third semiconductor layer over the second semiconductor layer. The first and the third semiconductor layers each includes a first semiconductor material, the second semiconductor layer includes a second semiconductor material, and the second semiconductor material is different from the first semiconductor material. The method also includes etching a first trench in a first region of the stack and a second trench in a second region of the stack. The first and the second trenches each exposes a side surface of the first, the second, and the third semiconductor layers. After forming the first trench and the second trench, the method includes removing a first portion of the first semiconductor layer to form first gaps and a second portion of the third semiconductor layer to form second gaps. The method also includes forming a first spacer in the first gaps and a second spacer in the second gaps. The first portion has a first width along a first direction connecting the first and the second trenches. The second portion has a second width along the first direction. The first width is greater than the second width.

In some embodiments, the removing of the first portion and the second portion are performed using an etching chemical. The first semiconductor layer has a first etch rate in the etching chemical. The third semiconductor layer has a second etch rate in the etching chemical. The first etch rate is greater than the second etch rate. In some embodiments, the second semiconductor layer has a third etch rate. The third etch rate is less than ten percent (10%) of the second etch rate. In some embodiments, the first semiconductor layer includes a first concentration of germanium (Ge), the second semiconductor layer includes a second concentration of Ge, and the first concentration is greater than the second concentration. In some embodiments, a difference between the first concentration of Ge and the second concentration of Ge is at least one percent (1%). In some embodiments, the first semiconductor layer has a first thickness along a second direction different from the first direction, the second semiconductor layer has a second thickness along the second direction, and the first thickness is greater than the second thickness. In some embodiments, the removing of the first portion and the second portion includes forming the first gap and the second gap each having a vertical sidewall that is aligned with each other along a third direction perpendicular to a top surface of the semiconductor substrate. In some embodiments, the structure further includes a dummy gate over the stack. The dummy gate wraps around top and side surfaces of the stack. Moreover, the etching of the first trench and the second trench includes etching the stack on both sides of the dummy gate. Furthermore, the method further includes epitaxially growing source/drain features in the first and the second trenches; forming an interlayer dielectric (ILD) over the source/drain features; removing the dummy gate; after the dummy gate has been removed, removing the first semiconductor layer and the third semiconductor layer; forming a gate dielectric layer around the second semiconductor layer; and after forming the gate dielectric layer, forming a gate electrode layer around the gate dielectric layer. In some embodiments, the gate electrode layer includes a first gate portion between the second semiconductor layer and the semiconductor substrate, and a second gate portion on an opposite side of the second semiconductor layer to the first gate portion. Moreover, the first gate portion has a first gate thickness along a second direction perpendicular to the semiconductor substrate, the second gate portion has a second gate thickness along the second direction, and the first gate thickness is greater than the second gate thickness.

In an exemplary aspect, the present disclosure is directed to a method. The method includes receiving a semiconductor structure. The semiconductor structure has a stack of semiconductor layers formed thereon. The stack of semiconductor layers includes a first semiconductor layer having a first thickness on a semiconductor substrate, a second semiconductor layer having a second thickness on the first semiconductor layer, and a third semiconductor layer having a third thickness on the second semiconductor layer. The first semiconductor layer has a first concentration of a first semiconductor material component, the third semiconductor having a second concentration of the first semiconductor material component, and the second semiconductor layer having a second semiconductor material component different from the first semiconductor material component. The method also includes forming a trench in the stack of semiconductor layers. The trench exposes a first sidewall of the first semiconductor layer, a second sidewall of the second semiconductor layer and a third sidewall of the third semiconductor layer. The method further includes etching the first and the third semiconductor layers through the exposed first and third sidewalls, respectively, to form a fourth sidewall of the first semiconductor layer and a fifth sidewall of the third semiconductor layer. Still further, the method includes forming a first spacer on the fourth sidewall and between the second semiconductor layer and the substrate, and a second spacer on the fifth sidewall and on a top surface of the second semiconductor layer. The first concentration differs from the second concentration or the first thickness differs from the third thickness. The first spacer has a first size, the second spacer has a second size, and the first size is greater than the second size.

In some embodiments, the receiving of the semiconductor structure includes receiving the third semiconductor layer having the second concentration lower than the first concentration. In some embodiments, the first semiconductor material component is silicon, the second semiconductor material component is germanium, and the second concentration is lower than the first concentration by at least one percent (1%). In some embodiments, the receiving of the semiconductor structure includes receiving the first semiconductor layer having the first thickness greater than the third thickness. In some embodiments, the first thickness is greater than the third thickness by at least five percent (5%).

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor device comprising:
   a semiconductor substrate having a top surface;
   a stack of channel layers over the semiconductor substrate, the stack including a first channel layer, a second channel layer over the first channel layer, and a third channel layer over the second channel layer, the first channel layer being separated from the semiconductor substrate, and the first, the second, and the third channel layers each extending in parallel to the top surface along a first direction;

a first gate portion between the first and the second channel layers, the first gate portion having a first gate thickness along a second direction perpendicular to the first direction;

a second gate portion between the second and the third channel layers, the second gate portion having a second gate thickness along the second direction;

a first inner spacer between the first and the second channel layers adjacent the first gate portion; and a second inner spacer between the second and the third channel layers adjacent the second gate portion, wherein the first gate thickness is greater than the second gate thickness, wherein the first and the second gate portions have the same gate length along the first direction, wherein the first inner spacer has a first width along the first direction, the second inner spacer has a second width along the first direction, and the first width is greater than the second width.

2. The semiconductor device of claim 1, wherein sidewalls of the first and second gate portions are aligned along the second direction.

3. The semiconductor device of claim 1, wherein:
the first inner spacer has a first spacer thickness extending from a top surface to a bottom surface of the first inner spacer along the second direction,
the second inner spacer has a second spacer thickness extending from a top surface to a bottom surface of the second inner spacer along the second direction, and
the first spacer thickness is greater than the second spacer thickness.

4. The semiconductor device of claim 1, further comprising a third gate portion between the semiconductor substrate and the first channel layer, wherein the third gate portion has a third gate thickness along the second direction greater than the first gate thickness.

5. The semiconductor device of claim 4, further comprising a third inner spacer between the semiconductor substrate and the first channel layer adjacent the third gate portion, wherein the third inner spacer has a third width along the first direction greater than the first width.

6. The semiconductor device of claim 5, wherein:
the first inner spacer has a first spacer thickness between a top and a bottom surface of the first inner spacer along the second direction,
the second inner spacer has a second spacer thickness between a top and a bottom surface of the second inner spacer along the second direction,
the third inner spacer has a third spacer thickness between a top and a bottom surface of the third inner spacer along the second direction,
the third spacer thickness is greater than the first spacer thickness, and the first spacer thickness is greater than the second spacer thickness.

7. A semiconductor device, comprising:
a substrate;
a stack of channel layers over the substrate and extending lengthwise along a first direction;
a gate structure wrapping around each of the channel layers, wherein the channel layers are separated from each other by portions of the gate structure; and
source/drain (S/D) features on sidewalls of the stack of channel layers, a stack of inner spacers adjacent to the gate structure and in between the stack of channel layers, the stack of inner spacers separating the gate structure from the S/D features, wherein each of the inner spacers includes a first side surface facing the gate structure, a second side surface facing one of the S/D features, wherein a width of the inner spacers between the first and the second side surfaces increases along the first direction from a top surface to a bottom surface of the stack of inner spacers, wherein a maximum vertical thickness of the inner spacers increases along a second direction perpendicular to the first direction from the top surface to the bottom surface of the stack of inner spacers, wherein a first gate portion wraps around a first one of the channel layers, a second gate portion wraps around a second one of the channel layers over the first one of the channel layers, and a third gate portion wraps around a third one of the channel layers over the second one of the channel layers.

8. The semiconductor device of claim 7,
wherein a first one of the inner spacers is disposed between the substrate and the first one of the channel layers, a second one of the inner spacers is disposed between the first one and the second one of the channel layers, and a third one of the inner spacers is disposed between the second one and the third one of the channel layers,
wherein a lower gate portion is disposed adjacent the first one of the inner spacers, a middle gate portion is disposed adjacent the second one of the inner spacers, and an upper gate portion is disposed adjacent the third one of the inner spacers,
wherein along the second direction, the first one of the inner spacers has a greater maximum vertical thickness than that of the lower gate portion, the second one of the inner spacers has a greater maximum vertical thickness than that of the middle gate portion, and the third one of the inner spacers has a greater maximum vertical thickness than that of the upper gate portion.

9. The semiconductor device of claim 8, wherein along the first direction, the first one of the inner spacers is longer than the second one of the inner spacers, and the second one of the inner spacers is longer than the third one of the inner spacers.

10. The semiconductor device of claim 9, wherein a first sidewall of the first one, the second one, and the third one of the inner spacers are aligned along the second direction, and a second sidewall of the first one, the second one, and the third one of the inner spacers are unaligned along the second direction.

11. The semiconductor device of claim 7, wherein the first, the second, and the third gate portions have a same length along the first direction.

12. The semiconductor device of claim 11, wherein sidewalls of the first, the second, and the third gate portions are aligned along the second direction.

13. The semiconductor device of claim 7, wherein the S/D features have slanted sidewall surfaces.

14. The semiconductor device of claim 13, wherein the S/D features extend below a top surface of the substrate.

15. The semiconductor device of claim 13, further comprising an interlayer dielectric (ILD) layer over a top surface of the S/D features.

16. The semiconductor device of claim 7, wherein the channel layers towards a bottom of the stack of channel layers have greater lateral widths along the first direction than the channel layers towards a top of the stack of channel layers.

17. A semiconductor device, comprising:
a semiconductor substrate having a top surface;
a first source/drain feature and a second source/drain feature over the semiconductor substrate;
a first channel layer over the semiconductor substrate, a second channel layer over the first channel layer, and a third channel layer over the second channel layer, the first, the second, and the third channel layers each directly contacting side surfaces of the first and the second source/drain features by extending lengthwise along a first direction parallel to the top surface;
a first gate portion between the substrate and the first channel layer, a second gate portion between the first and the second channel layers, and a third gate portion between the second and the third channel layers; and
a first inner spacer adjacent to the first gate portion and between the substrate and the first channel layer, a second inner spacer adjacent to the second gate portion and between the first and the second channel layers, and a third inner spacer adjacent to the third gate portion and between the second and the third channel layers,
wherein the first, the second, and the third gate portions each has a width that is substantially the same as each other along the first direction,
wherein the first, the second, and the third gate portions each has a thickness that is different from each other along a second direction perpendicular to the first direction,
wherein the first gate portion is thicker than the second gate portion, and the second gate portion is thicker than the third gate portion.

18. The semiconductor device of claim 17, wherein along the first direction, the first inner spacer is wider than the second inner spacer, and the second inner spacer is wider than the third inner spacer.

19. The semiconductor device of claim 17, wherein the first, the second, and the third inner spacers have different thicknesses along the second direction.

20. The semiconductor device of claim 19, wherein the first inner spacer is thicker than the second inner spacer, and the second inner spacer is thicker than the third inner spacer.

* * * * *